US012658156B2

(12) United States Patent
Zhang et al.

(10) Patent No.: US 12,658,156 B2
(45) Date of Patent: Jun. 16, 2026

(54) DRIVER CIRCUIT AND DRIVING METHOD THEREOF, ARRAY SUBSTRATE AND DISPLAY APPARATUS

(71) Applicants: BOE MLED Technology Co., Ltd., Beijing (CN); BOE TECHNOLOGY GROUP CO., LTD., Beijing (CN)

(72) Inventors: Junwei Zhang, Beijing (CN); Wei Hao, Beijing (CN); Feifei Wang, Beijing (CN); Wengang Su, Beijing (CN); Kaimin Yin, Beijing (CN); Xingce Shang, Beijing (CN); Taotao Duan, Beijing (CN); Liguang Geng, Beijing (CN); Huangfei Cha, Beijing (CN); Yu Deng, Beijing (CN)

(73) Assignees: BOE MLED Technology Co., Ltd., Beijing (CN); BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 19/010,564

(22) Filed: Jan. 6, 2025

(65) Prior Publication Data

US 2025/0140214 A1 May 1, 2025

Related U.S. Application Data

(63) Continuation of application No. 17/923,946, filed as application No. PCT/CN2021/131003 on Nov. 16, 2021, now Pat. No. 12,217,715.

(51) Int. Cl.
*G09G 3/36* (2006.01)
*G02F 1/1335* (2006.01)
(Continued)

(52) U.S. Cl.
CPC ...... *G09G 3/3611* (2013.01); *G02F 1/133603* (2013.01); *G02F 1/133612* (2021.01);
(Continued)

(58) Field of Classification Search
CPC ....... G09G 2310/08; G09G 2310/0286; G09G 2310/0267; G09G 2310/027;
(Continued)

(56) References Cited

U.S. PATENT DOCUMENTS

2003/0043126 A1    3/2003   Fujino et al.
2018/0211582 A1*   7/2018   Sakariya .................. G09G 3/32

FOREIGN PATENT DOCUMENTS

CN        111696478 A      9/2020
CN        212342248 U      1/2021
CN        112951151 A      6/2021

OTHER PUBLICATIONS

Chinese First Office Action (with English translation) for corresponding Application No. CN202180003407.8, dated Jul. 9, 2025, 26 pages.

* cited by examiner

*Primary Examiner* — Dong Hui Liang
(74) *Attorney, Agent, or Firm* — Dority & Manning, P.A.

(57) ABSTRACT

A driver circuit includes a logic control component and a plurality of pins coupled to the logic control component. The plurality of pins include a clock pin, a data pin and at least two output pins. The clock pin is configured to receive a clock signal. The data pin is configured to receive, under control of the logic control component, a data signal in a period of an active level of the clock signal. The logic control component is configured to generate a driving control signal corresponding to each output pin according to the data signal, so as to control an electrical signal flowing through the output pin.

19 Claims, 11 Drawing Sheets

(51) Int. Cl.
*G02F 1/13357*        (2006.01)
*H01L 25/16*         (2023.01)
*H10W 90/00*         (2026.01)

(52) U.S. Cl.
CPC .  *G09G 2310/0243* (2013.01); *G09G 2330/00*
        (2013.01); *H10W 90/00* (2026.01)

(58) Field of Classification Search
CPC ... G09G 2310/0291; G09G 2310/0275; G09G
        2310/0297; G09G 2310/0272; G09G
        3/32; G09G 3/2088; G09G 3/2012; G09G
        3/3406; G09G 2320/0693; G09G
        2320/041; G09G 2330/021; G09G
        2330/028; G09G 2340/0435; G09G
        3/3233; G09G 2300/0857; G09G
        2300/0426; G09G 2300/0804; G09G
        2300/0413; G09G 2300/0819
See application file for complete search history.

MIC

| OutP (Out1/P) | OutP (Out2/P) |
| Di_out(P) | DataP |
| VCCP(P) | GNDP(P) |
| Di_in(P) | CLKP(P) |
| OutP (Out3/P) | OutP (Out4/P) |

H(Y)

X

MIC

| OutP (Out1/P) | OutP (Out3/P) |
| Di_out(P) | DataP(P) |
| VCCP(P) | GNDP(P) |
| Di_in(P) | CLKP(P) |
| OutP (Out2/P) | OutP (Out4/P) |

H(Y)

X

MIC

H(Y)

MIC

DRIVER CIRCUIT AND DRIVING METHOD THEREOF, ARRAY SUBSTRATE AND DISPLAY APPARATUS

CROSS-REFERENCE TO RELATED APPLICATIONS

This application is a continuation of U.S. patent application Ser. No. 17/923,946, filed on Nov. 8, 2022, which claims priority to International Patent Application No. PCT/CN2021/131003, filed on Nov. 16, 2021, which is incorporated herein by reference in its entirety.

TECHNICAL FIELD

The present disclosure relates to the field of display technologies, and in particular, to a driver circuit and a driving method thereof, an array substrate, and a display apparatus.

BACKGROUND

Light emitting diodes (LEDs) have been widely applied to the fields of traditional display, near-eye display, three-dimensional (3D) display and transparent display due to their advantages such as high efficiency, high luminance, high reliability, energy saving and fast response speed.

SUMMARY

In an aspect, a driver circuit is provided. The driver circuit includes a logic control component and a plurality of pins coupled to the logic control component. The plurality of pins include a clock pin, a data pin and at least two output pins. The clock pin is configured to receive a clock signal. The data pin is configured to receive, under control of the logic control component, a data signal in a period of an active level of the clock signal. The logic control component is configured to generate a driving control signal corresponding to each output pin according to the data signal, so as to control an electrical signal flowing through the output pin.

In some embodiments, the data signal includes address information and luminance information; the driver circuit is configured with address information. The logic control component is further configured to: compare the address information in the data signal with the address information of the driver circuit; and, in a case where the address information in the data signal matches the address information of the driver circuit, acquire the luminance information in the data signal, and generate the driving control signal according to the luminance information in the data signal.

In some embodiments, the data signal includes a first data sub-signal and a second data sub-signal. The address information in the data signal includes first address information located in the first data sub-signal and second address information located in the second data sub-signal. The luminance information includes amplitude information located in the first data sub-signal and duty ratio information located in the second data sub-signal. The logic control component is further configured to: compare the first address information with the address information of the driver circuit; generate, in a case where the first address information matches the address information of the driver circuit, an amplitude signal according to the amplitude information to control an amplitude of the electrical signal flowing through the output pin; and compare the second address information with the address information of the driver circuit; and generate, in a case where the second address information matches the address information of the driver circuit, a duty ratio selection signal according to the duty ratio information to control a duration of the electrical signal flowing through the output pin.

In some embodiments, the plurality of pins further include an address pin and a relay pin. The address pin is configured to receive an address signal. The logic control component is further configured to: configure address information of the driver circuit according to the address signal; and generate a relay signal according to the address signal. The relay pin is configured to output the relay signal.

In some embodiments, the plurality of pins further include a chip power supply pin and a grounding pin. The chip power supply pin is configured to receive a power supply voltage signal used for driving the driver circuit to work. The grounding pin is configured to receive a grounding voltage signal.

In some embodiments, a number of the plurality of pins is an even number. In a length direction of the driver circuit, the plurality of pins are arranged in two rows, and a number of pins in each row is the same.

In some embodiments, the number of the at least two output pins is four. The pins in each row include two output pins, and at least one pin of the plurality of pins except all the output pins is disposed between the two output pins.

In another aspect, a driving method of a driver circuit is provided. The driving method of the driver circuit is applied to the driver circuit as described in any one of the above embodiments. The driving method includes: receiving, by the clock pin of the driver circuit, the clock signal; controlling, by the logic control component in the driver circuit, the data pin of the driver circuit to receive the data signal in the period of the active level of the clock signal; and generating, by the logic control component, the driving control signal corresponding to each output pin of the driver circuit according to the data signal, so as to control the electrical signal flowing through the output pin.

In some embodiments, the period of the active level of the clock signal includes a period of a rising edge of the clock signal.

In some embodiments, a frequency of the clock signal is equal to a frequency of the data signal.

In some embodiments, the data signal includes address information and luminance information; the driver circuit is configured with address information. Generating the driving control signal corresponding to each output pin of the driver circuit according to the data signal includes: comparing, by the logic control component, the address information in the data signal with the address information of the driver circuit; and, in a case where the address information in the data signal matches the address information of the driver circuit, acquiring, by the logic control component, the luminance information in the data signal, and generating, by the logic control component, the driving control signal according to the luminance information in the data signal.

In some embodiments, the clock signal includes a first clock sub-signal and a second clock sub-signal; the data signal includes a first data sub-signal and a second data sub-signal; the address information in the data signal includes first address information located in the first data sub-signal and second address information located in the second data sub-signal; the luminance information includes amplitude information located in the first data sub-signal and duty ratio information located in the second data sub-signal. The driving method includes a driving configuration phase and a device control phase. In the driving configuration phase, the logic control component controls, in a period of an active level of the first clock sub-signal, the data pin to receive the first address information and compare the first address information with the address information of the driver circuit; the logic control component controls, in a case where the first address information matches the address information of the driver circuit, the data pin to acquire the amplitude information and generate an amplitude signal according to the amplitude information. In the device control phase, the logic control component controls, in a period of an active level of the second clock sub-signal, the data pin to receive the second address information and compare the second address information with the address information of the driver circuit; the logic control component controls, in a case where the second address information matches the address information of the driver circuit, the data pin to acquire the duty ratio information and generate a duty ratio selection signal according to the duty ratio information.

In some embodiments, the clock signal further includes a third clock sub-signal; the data signal further includes a third data sub-signal; the address information in the data signal further includes third address information located in the third data sub-signal; the luminance information further includes initialization information located in the third data sub-signal. In the driving configuration phase, the logic control component controls, in a period of an active level of the third clock sub-signal, the data pin to receive the third address information and compare the third address information with the address information of the driver circuit; the logic control component controls, in a case where the third address information matches the address information of the driver circuit, the data pin to acquire the initialization information, so as to perform initialize configuration on the driver circuit.

In some embodiments, a frequency of the first clock sub-signal is equal to a frequency of the first data sub-signal; a frequency of the second clock sub-signal is equal to a frequency of the second data sub-signal; and a frequency of the third clock sub-signal is equal to a frequency of the third data sub-signal.

In yet another aspect, an array substrate is provided. The array substrate includes a plurality of driver circuits each as described in any one of the above embodiments, and a plurality of device groups respectively coupled to output pins of the plurality of driver circuits. A device group includes at least one functional element.

In some embodiments, the array substrate further includes a plurality of signal lines. The plurality of driver circuits are arranged in a plurality of columns in a second direction. The plurality of signal lines include a plurality of clock signal lines each extending in the first direction, a plurality of data signal lines each extending in the first direction and a plurality of device power supply signal lines each extending in the first direction. A clock signal line is coupled to clock pins of a column of driver circuits. A data signal line is coupled to data pins of the column of driver circuits. Device groups coupled to the column of driver circuits are further coupled to at least one device power supply signal line.

In some embodiments, the plurality of device groups are arranged in a plurality of columns in the second direction. The at least two device groups coupled to the driver circuit are respectively located on two sides of the driver circuit. A number of device power supply signal lines corresponding to the column of driver circuits is two, and the two device power supply signal lines are respectively located on two opposite sides of the column of driver circuits.

In some embodiments, two columns of device groups located between any two adjacent columns of driver circuits are coupled to a same device power supply signal line.

In some embodiments, the driver circuit includes an address pin and a relay pin. In the column of driver circuits, a relay pin of an N-th driver circuit is coupled to an address pin of an (N+1)-th driver circuit, N is a positive integer.

In some embodiments, the driver circuit includes an address pin and a relay pin. In the plurality of driver circuits, a relay pin of an M-th driver circuit is coupled to an address pin of an (M+1)-th driver circuit, M is a positive integer.

In some embodiments, the plurality of signal lines further include a plurality of address signal lines. A relay pin of an N-th driver circuit is coupled to an end of an address signal line, and an address pin of an (N+1)-th driver circuit is coupled to another end of the address signal line.

In some embodiments, the plurality of signal lines further include at least one feedback signal line. In a case where in a same column of driver circuits, a relay pin of an N-th driver circuit is coupled to an address pin of an (N+1)-th driver circuit, a relay pin of a last driver circuit in any column of driver circuits is coupled to a feedback signal line. In a case where in the plurality of driver circuits, a relay pin of an M-th driver circuit is coupled to an address pin of an (M+1)-th driver circuit, a relay pin of a last driver circuit is coupled to a feedback signal line.

In some embodiments, the driver circuit further includes a chip power supply pin and a grounding pin. The plurality of signal lines further include a plurality of chip power supply signal lines each extending in the first direction and a plurality of grounding signal lines each extending in the first direction. A chip power supply signal line is coupled to chip power supply pins of the column of driver circuits. A grounding signal line is coupled to grounding pins of the column of driver circuits.

In some embodiments, the array substrate further includes a controller circuit coupled to the plurality of signal lines. The controller circuit is configured to transmit signals to the plurality of signal lines, respectively.

In some embodiments, the array substrate further includes a substrate, a driving circuit layer disposed on a side of the substrate, and a device layer disposed on the side of the substrate. The driving circuit layer includes a driving line layer, an insulating layer and a wiring layer that are stacked in sequence. The plurality of signal lines are located in the driving line layer. The plurality of driver circuits and the plurality of device groups are located in the device layer. The wiring layer includes a plurality of chip pads bonded to the plurality of driver circuits, a plurality of device pads bonded to the plurality of device groups, and a plurality of connection lines. A part of the plurality of connection lines are coupled to the plurality of chip pads and the driving line layer, and another part of the plurality of connection lines are coupled to the plurality of device pads and the driving line layer.

In yet another aspect, a display apparatus is provided. The display apparatus includes the array substrate as described in any one of the above embodiments.

In some embodiments, the display apparatus further includes a driving substrate disposed on a side of the array substrate, a color filter substrate disposed on a side of the driving substrate away from the array substrate, and a liquid crystal layer disposed between the driving substrate and the color filter substrate.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these accompanying drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
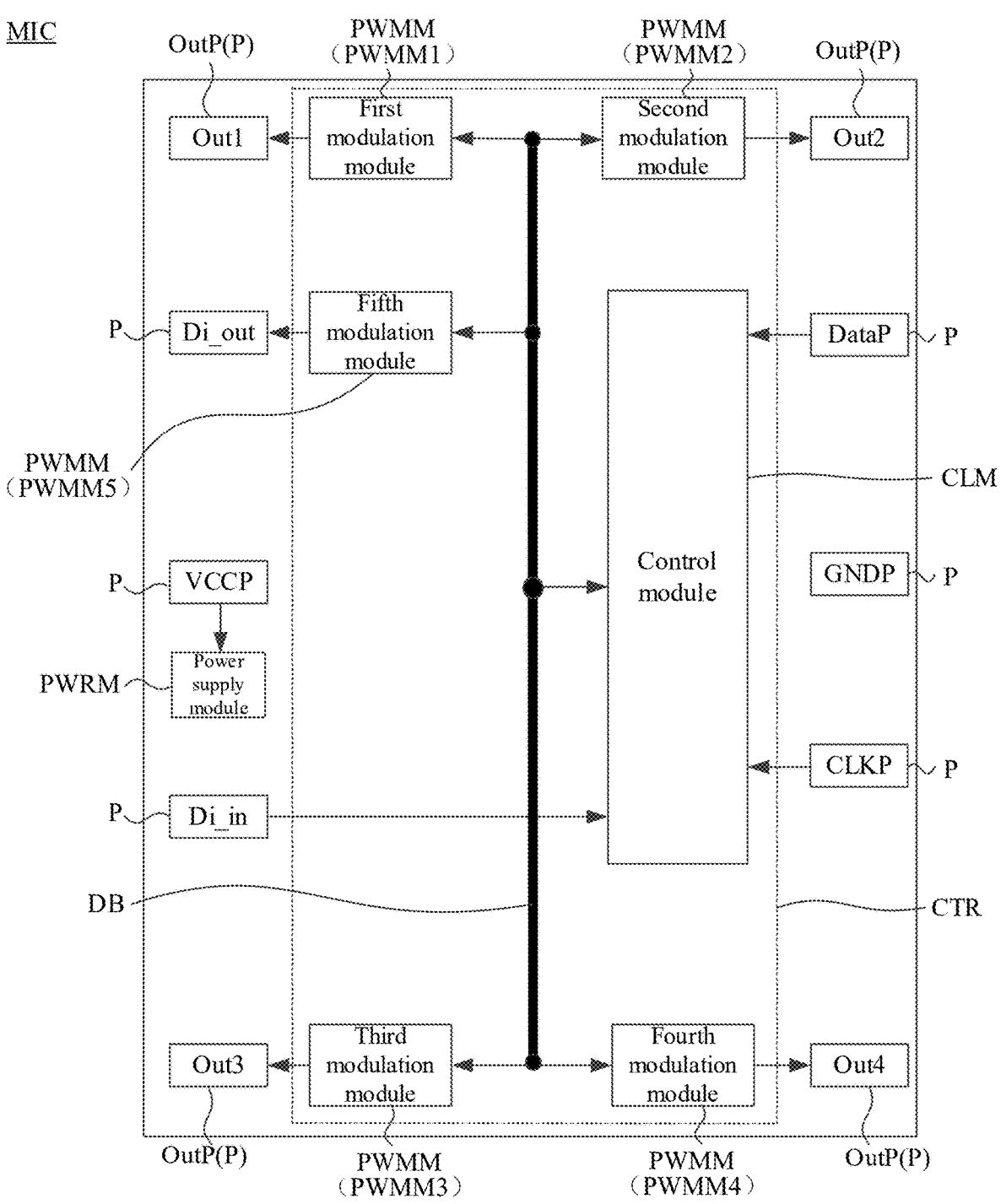
FIG. 1 is a structural diagram of a driver circuit, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the term "coupled" and derivatives thereof may be used. For example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining that" or "in response to detecting", depending on the context. Similarly, depending on the context, the phrase "if it is determined that" or "if [a stated condition or event] is detected" is optionally construed as "in a case where it is determined that", "in response to determining that", "in a case where [the stated condition or event] is detected", or "in response to detecting [the stated condition or event]".

The phrase "applicable to" or "configured to" as used herein indicates an open and inclusive expression, which does not exclude devices that are applicable to or configured to perform additional tasks or steps.

Additionally, the phrase "based on" as used herein is meant to be open and inclusive, since a process, a step, a calculation or other action that is "based on" one or more of the stated conditions or values may, in practice, be based on additional conditions or values beyond those stated.

As used herein, the term such as "about" or "approximately" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

Some embodiments of the present disclosure provide a driver circuit and a driving method thereof, an array substrate and a display apparatus. The driver circuit and the driving method thereof, the array substrate and the display apparatus will be schematically described below with reference to the accompanying drawings.

Figure 12:
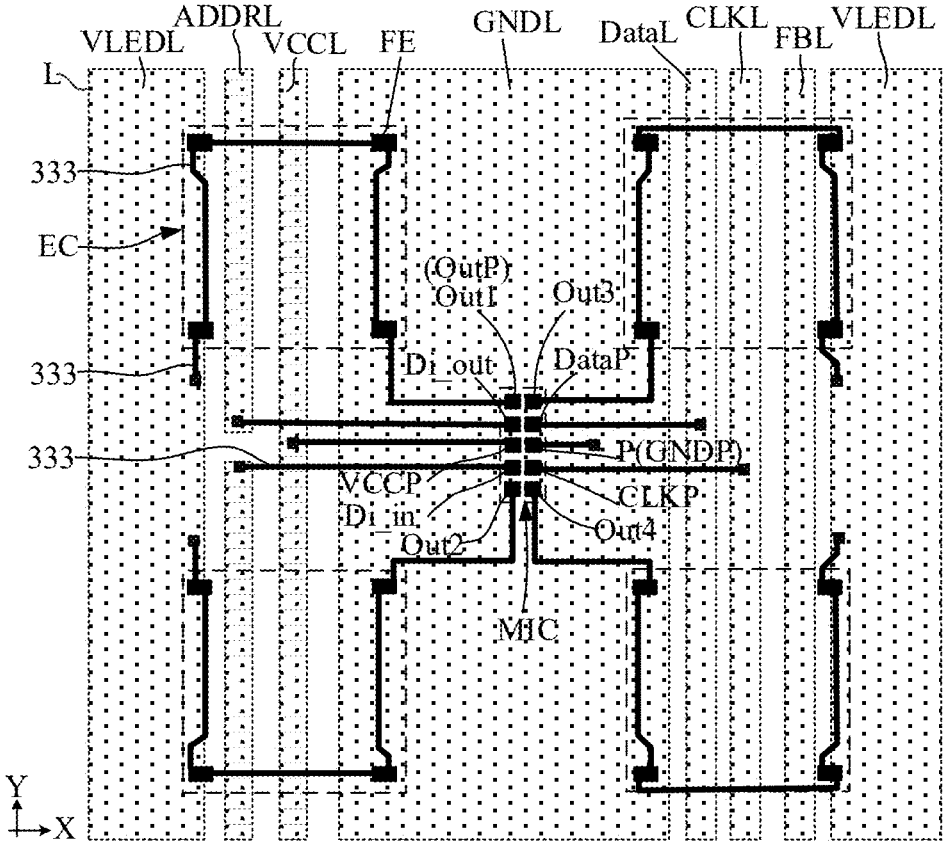
FIG. 12 is a partial structural diagram of an array substrate, in accordance with some embodiments of the present disclosure.
Figure 13:
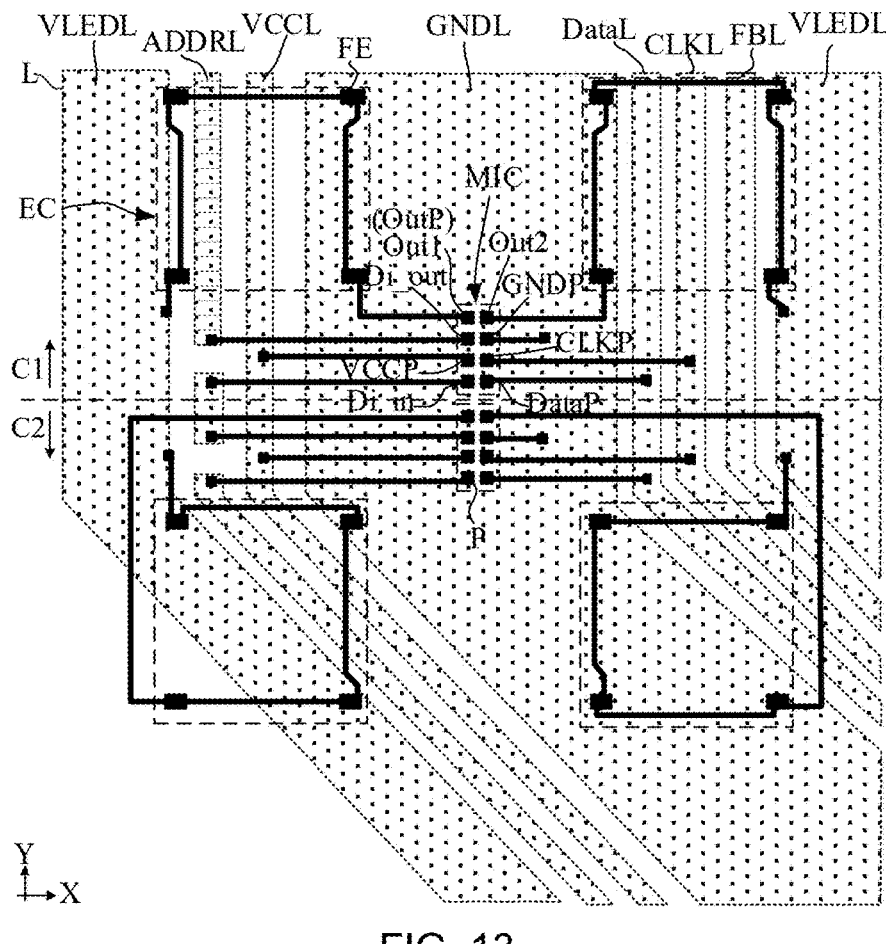
FIG. 13 is a partial structural diagram of another array substrate, in accordance with some embodiments of the present disclosure.

In some embodiments, as shown in FIGS. 8 to 11, the array substrate 100 includes a plurality of driver circuits MIC and at least two device groups EC coupled to each driver circuit MIC. As shown in FIGS. 12 and 13, each device group EC includes at least one functional element FE. The plurality of driver circuits MIC may be, for example, bonded to the array substrate 100.

In some examples, each device group EC may include one, two, three or four functional elements FE. In a case where the device group EC includes at least two functional elements FE, the at least two functional elements FE may be, for example, connected in series. The number of functional elements FE included in each of the device groups EC may be set according to actual needs, which is not limited in the embodiments of the present disclosure.

Optionally, in the embodiments of the present disclosure, the functional element FE may be a current-driven electronic element, and the current-driven electronic element may be, for example, a heating element, a light-emitting element, an acoustic element, etc. The functional element FE may be an electronic element that achieves a sensing function, and the electronic element may be, for example, a photo-sensitive element, a thermo-sensitive element, acousto-electric transducing element, etc. The types of functional elements FE included in each device group EC may be the same or different. The number and the types of functional elements FE included in one of any two device groups EC and the number and the types of functional elements FE included in the other of the any two device groups EC may be the same or different, respectively.

For example, functional elements FE included in all of the device groups EC are all the same functional element, which may be, for example, the light-emitting element. The number of functional elements FE included in each of the device group EC is the same. For example, the device groups EC each include four functional elements FE. The electrical connection manner of the functional elements FE included each of the device groups EC is the same. For example, the functional elements FE included in each of the device groups EC are sequentially connected in series. By setting the device groups EC in a same setting manner, it is conducive to reducing a difference among the device groups EC, which reduces both a difference in signals received by the device groups EC and a difference in luminance of the device groups EC, so as to facilitate driving and debugging of the array substrate 100.

For example, the light-emitting element may be a light-emitting diode (LED), a micro light-emitting diode (Micro LED), a mini light-emitting diode (Mini LED), an organic light-emitting diode (OLED), a quantum dot light-emitting diode (QLED), a quantum dot-organic light-emitting diode (QD-OLED) or a polymer light-emitting diode (PLED), etc.

Optionally, in the embodiments of the present disclosure, the driver circuit MIC may be an integrated circuit or a packaged chip with pins.

In some examples, as shown in FIG. 1, the driver circuit MIC includes a logic control component CTR and a plurality of pins P coupled to the logic control component CTR. The plurality of pins P include a clock pin CLKP, a data pin DataP and at least two output pins OutP. For example, the number of output pins OutP may be two, three, four, etc.

For example, the clock pin CLKP is configured to receive a clock signal. The clock signal may be transmitted to the logic control component CTR and received by the logic control component CTR.

The data pin DataP is configured to receive, under control of the logic control component CTR, a data signal in a period of an active level of the clock signal.

For example, the logic control component CTR may perform detection and determination on the clock signal, if the clock signal is determined to be in the period of the active level, the data pin DataP may be controlled to receive the data signal (i.e., sample the data signal), and the data signal received by the data pin DataP may be transmitted to the logic control component CTR.

Figure 6:
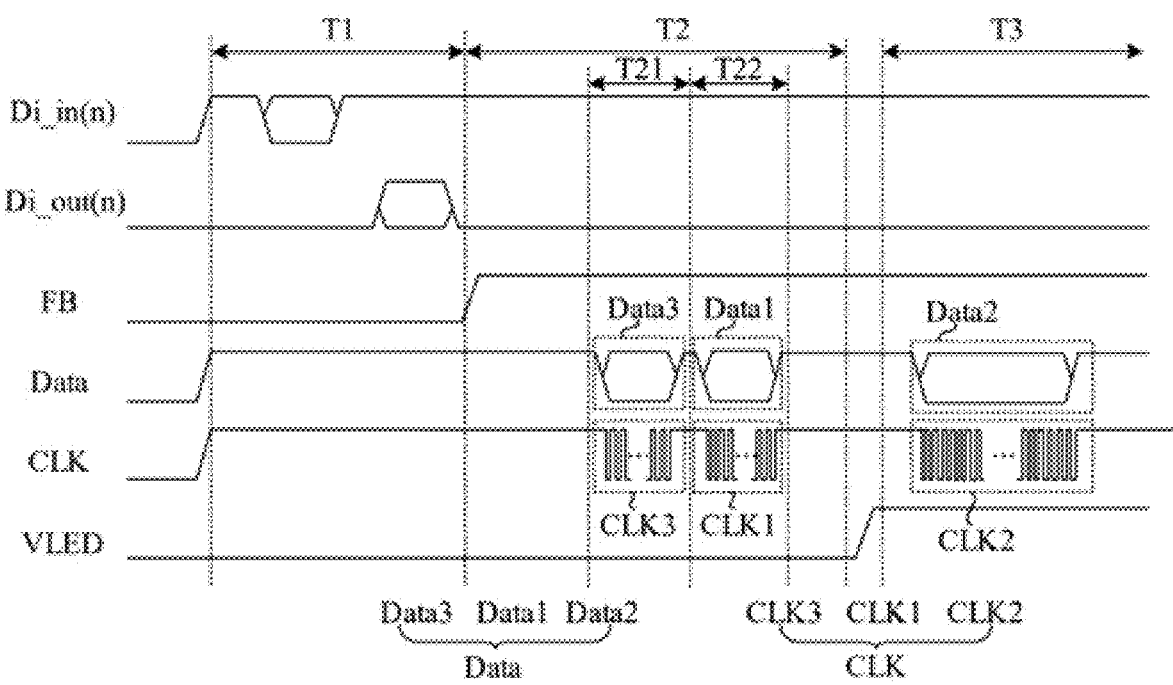
FIG. 6 is a timing diagram corresponding to the driver circuit shown in FIG. 1, in accordance with the embodiments of the present disclosure.

For example, as shown in FIG. 6, the data signal Data may be transmitted in a form of a data packet. In a work cycle of the driver circuit MIC, the data pin DataP may receive a plurality of data packets under the control of the logic control component CTR. In the plurality of data packets, there is an interval between any two adjacent data packets. Optionally, each data packet may be referred to as a data sub-signals. The plurality of data packets may include a first data sub-signal Data1, a second data sub-signal Data2 and a third data sub-signal Data3.

For example, the clock signal may be a square wave signal, and the data signal Data may be a digital signal. The clock signal has a plurality of active levels that are sequentially provided at intervals. The logic control component CTR may control the data pin DataP to receive (i.e., sample) the data signal Data once, and receive a sampled data signal Data in a period of each active level.

It may be understood that, as shown in FIG. 6, the clock signal CLK may include a plurality of clock sub-signals, such as a first clock sub-signal CLK1, a second clock sub-signal CLK2 and a third clock sub-signal CLK3. A duration of each clock sub-signal may correspond to a transmission duration of a single data packet. For example, a duration of the first clock sub-signal CLK1 may correspond to a transmission duration of the first data sub-signal Data1, a duration of the second clock sub-signal CLK2 may correspond to a transmission duration of the second data sub-signal Data2, and a duration of the third clock sub-signal CLK3 may correspond to a transmission duration of the third data sub-signal Data3. Each clock sub-signal has a constant cycle (for example, cycles of different clock sub-signals may be the same), and a level of the clock sub-signal switches between a high level and a low level in a single cycle.

For example, between any two adjacent clock sub-signals of the plurality of clock sub-signals, the clock pin CLKP may receive a high-level signal, and correspondingly, the data pin DataP may also receive a high-level signal.

Optionally, the period of the active level of the clock signal CLK may include a period of a rising edge of the clock signal CLK. That is, the data signal Data may be received once each time the period of the rising edge of the clock signal CLK is detected by the logic control component CTR.

It will be understood that a duty ratio of the clock signal CLK may be adjustable. That is, in a cycle of the clock signal CLK, a duration of the high level and a duration of the low level are both adjustable. The data signal Data is received in the period of the rising edge of the clock signal CLK, so that a regularity and an accuracy of receiving the data signal Data by the logic control component CTR may be improved.

Of course, the period of the active level of the clock signal CLK in the embodiments of the present disclosure may be implemented in other examples and specifically set according to actual needs, which is not limited in the embodiments of the present disclosure. For example, the period of the active level of the clock signal CLK may further include a period of a high level of the clock signal CLK and a period of a falling edge of the clock signal CLK.

Optionally, a frequency of the clock signal CLK is equal to a frequency of the data signal Data. In this way, it is conducive to ensuring that the logic control component CTR is able to receive the data signal Data after detecting the period of the active level of the clock signal CLK each time, thereby avoiding a situation that the data signal Data can not be sampled according to the clock signal CLK.

For example, the frequency of the clock signal CLK may be 8 MHz.

For example, in a case where the clock signal CLK includes the first clock sub-signal CLK1, the second clock sub-signal CLK2 and the third clock sub-signal CLK3, and the data signal includes the first data sub-signal Data1, the second data sub-signal Data2 and the third data sub-signal Data3, a frequency of the first clock sub-signal CLK1 is, for example, equal to a frequency of the first data sub-signal Data1; a frequency of the second clock sub-signal CLK2 is, for example, equal to a frequency of the second data sub-signal Data2; a frequency of the third clock sub-signal CLK3 is, for example, equal to a frequency of the third data sub-signal Data3. In this way, it is possible to enable the logic control component CTR to receive each data sub-signal.

In some other embodiments of the present disclosure, if the frequency of the clock signal CLK is different from the frequency of the data signal Data, after the clock signal CLK is received, the logic control component CTR may perform, for example, frequency division processing or frequency multiplication processing on the clock signal CLK to generate a frame frequency signal. That is, a frequency of the frame frequency signal may be greater or less than the frequency of the clock signal CLK, so that the frequency of the generated frame frequency signal may be equal to the frequency of the data signal Data. Thus, the logic control component CTR may receive (i.e., sample) the data signal Data according to the frame frequency signal, so as to ensure the regularity and the accuracy of receiving the data signal Data.

For example, the logic control component CTR is configured to generate a driving control signal corresponding to each output pin OutP according to the data signal Data, so as to control an electrical signal (e.g., a current signal) flowing through the output pin OutP. Each output pin OutP may be coupled to a single device group EC. That is, the number of device groups EC coupled to each driver circuit MIC may be equal to the number of output pins OutP included in the driver circuit MIC. In this way, the electrical signal flowing through each output pin OutP may be transmitted to a respective device group EC.

For example, in the period of the active level of the clock signal CLK, the logic control component CTR may generate the driving control signal according to the data signal Data received (i.e., sampled) each time by the data pin DataP. The logic control component CTR may generate, for example, at least two driving control signals, and the driving control signals may be in a one-to-one correspondence with the output pins OutP. In this way, the logic control component CTR may control, by means of each driving control signal, an electrical signal flowing through a respective output pin OutP, thereby controlling a working state of a respective device group EC.

In an implementation manner, the clock signal is included in a data signal, and a driver circuit receives the data signal including the clock signal only through a data pin. This means that the clock signal occupies part of a duration of the data signal, which reduces a frequency and a rate of the data signal, thereby reducing a working frequency of the driver circuit. As a result, a working frequency (e.g., a data refresh frequency) of the array substrate is reduced.

In addition, in the above implementation manner, in a process that the driver circuit generates the driving control signal to control the working state of the device group, a crystal oscillator inside the driver circuit corrects the clock signal, so that clock signals respectively received by different driver circuits are aligned. However, due to inevitable process errors in a manufacturing process, there is a difference among crystal oscillators respectively inside different driver circuits, thereby resulting in a difference in frequencies of different crystal oscillators. Thus, errors are prone to occur in a process of receiving the data signal according to the clock signal.

In the driver circuit MIC provided in some embodiments of the present disclosure, the clock pin CLKP is provided, and the clock signal CLK and the data signal Data are separated, so that the clock pin CLKP and the data pin DataP independently receive the clock signal CLK and the data signal Data, respectively. As a result, the part of the duration of the data signal Data occupied by the clock signal CLK is released, and in turn, it is possible to fill in the part of the duration with the data signal Data, so that the data signal Data received by the data pin DataP is of a single type. In this way, it is conducive to improving the frequency and the rate of the data signal Data, so as to improve the working frequency of the driver circuit MIC and the working frequency of the array substrate 100. According to a calculation of inventors, the rate of the data signal Data may be improved by approximately 30%.

Figure 8:
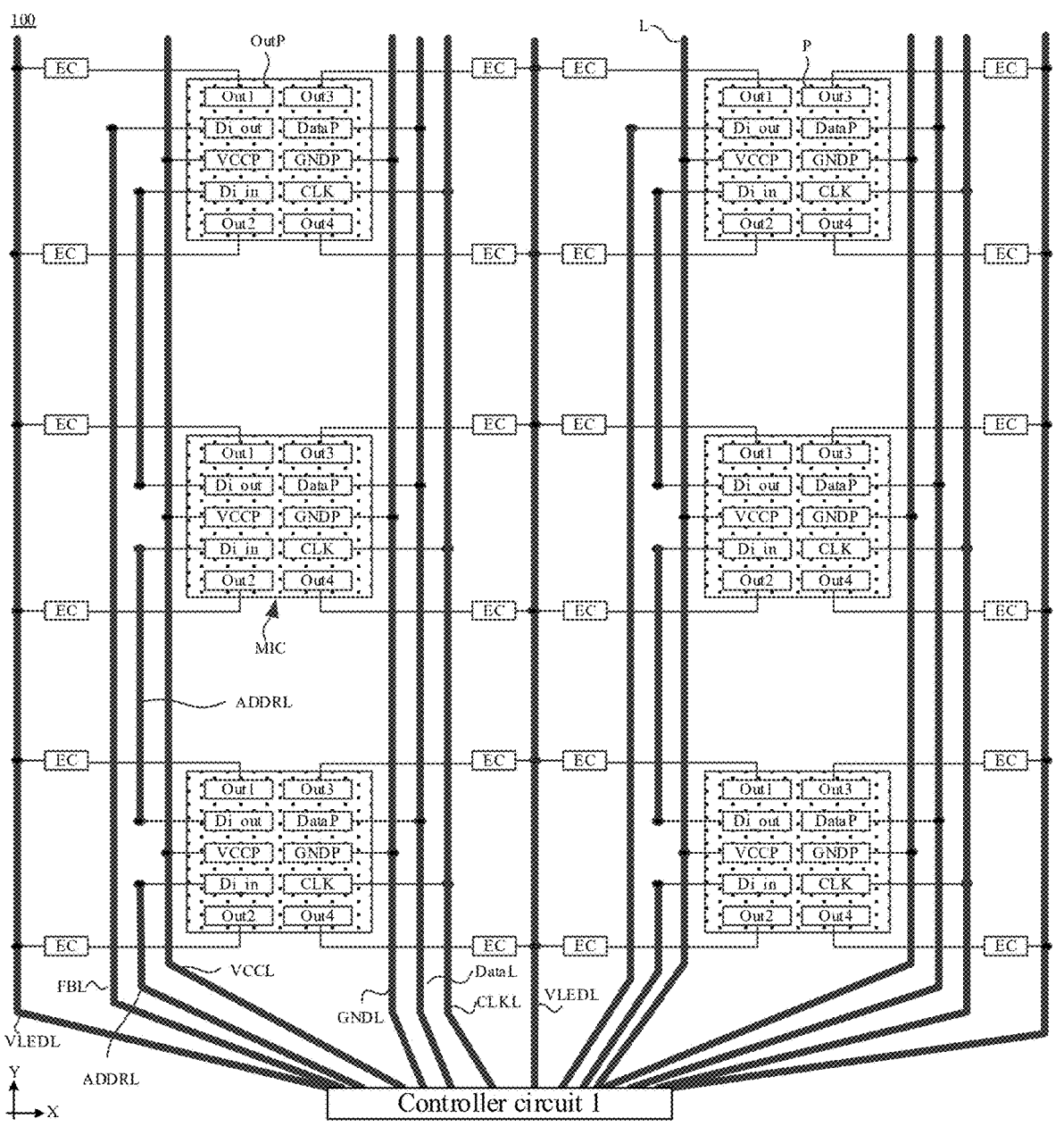
FIG. 8 is a structural diagram of an array substrate, in accordance with some embodiments of the present disclosure.

Moreover, in the array substrate 100 provided in some embodiments of the present disclosure, a controller circuit 1 as shown in FIG. 8 provides the clock signals CLK for the clock pins CLKP of all the driver circuits MIC, so that frequencies of the clock signals CLK respectively received by different driver circuits MIC are equal. As a result, it is conducive to improving the accuracy of receiving the data signal Data.

In addition, it will be understood that, since each device group EC may be connected to the output pin OutP of the respective driver circuit MIC to form a signal channel, and the driver circuit MIC includes the plurality of output pins OutP, the driver circuit MIC provided in the embodiments of the present disclosure may also be referred to as a multi-channel driver circuit.

In the implementation manner, the driver circuit includes only a single output pin, and the driver circuit is coupled to a device group only through the single output pin. The driver circuit may be referred to as a single-channel driver circuit. In this way, the number of driver circuits included in the array substrate is equal to the number of device groups, and the number of required driver circuits is relatively great.

In the embodiments of the present disclosure, the driver circuit MIC is the multi-channel driver circuit and includes at least two output pins OutP. Each driver circuit MIC may be coupled to at least two device groups EC and drive the at least two device groups EC simultaneously. In this way, the number of driver circuits MIC required for the array substrate 100 may be greatly reduced, so that a cost of the array substrate may be reduced. Moreover, since the number of driver circuits MIC required for the array substrate 100 is reduced, it is not only conducive to reducing a difficulty of manufacturing the array substrate 100, shortening a duration for installing and bonding the driver circuits MIC to the array substrate and improving an efficiency of manufacturing the array substrate 100, but also conducive to reducing an influence of a bonding yield of the driver circuit MIC on a yield of the array substrate 100, and thus improving the yield of the array substrate 100. It will be noted that, with regard to the phrase "simultaneously driving" or "simultaneously working" mentioned in the embodiments of the present disclosure, there may be a sequential order of nanosecond in terms of time.

In addition, in the embodiments of the present disclosure, on the basis of reducing the number of driver circuits MIC required for the array substrate 100, it is also conducive to reducing an area occupied by the driver circuits MIC. For example, the driver circuit MIC (which may be referred to as a four-channel driver circuit) in the embodiments of the present disclosure includes four output pins OutP, and an area of the driver circuit MIC may be 0.5936 mm². However, an area of the single-channel driver circuit is 0.1681 mm², and a sum of areas of four single-channel driver circuits that respectively control four device groups is 0.6724 mm². It can be seen that the area occupied by each driver circuit MIC in the embodiments of the present disclosure is less than the sum of the areas occupied by the four single-channel driver circuits. Therefore, in the embodiments of the present disclosure, it is conducive to reducing an area of the array substrate 100.

Hereinafter, in an example where the functional element FE included in each device group EC is the light-emitting element, and the light-emitting element is the Mini LED. For example, the electrical signal (e.g., a current) flowing through each output pin OutP has a plurality of parameters, which may include an amplitude of the current flowing through the output pin OutP and a duration of the current flowing through the output pin OutP.

It will be noted that, in a case where the functional element FE emits light, luminance of the functional element FE is related to an amplitude of a current received thereby and a duration of the current received thereby. For example, in a case where the duration of the current received by the functional element FE is a constant value, the greater the amplitude of the current, the higher the luminance of the functional element FE; the less the amplitude of the current, the lower the luminance of the functional element FE. In a case where the amplitude of the current received by the functional element FE is a constant value, the longer the duration of the current received by the functional element FE, the higher the luminance; the shorter the duration of the current received by the functional element FE, the lower the luminance. In this way, luminance of each functional element FE may be controlled by controlling parameters of a current flowing through the respective output pin OutP.

For example, luminance of functional elements FE included in a same device group EC may be the same. Luminance of functional elements FE respectively included in different device groups EC may be the same or different.

In some embodiments, the data signal Data received by the data pin DataP may include address information and luminance information. The logic control component CTR is further configured to: compare the address information in the data signal Data with address information of the driver circuit MIC; and, in a case where the address information in the data signal Data matches the address information of the driver circuit MIC, acquire the luminance information in the data signal Data, and generate the driving control signal according to the luminance information in the data signal Data.

In some examples, each driver circuit MIC is configured with address information, and the address information may represent a position of the driver circuit MIC in the array substrate 100. Positions of different driver circuits MIC in the array substrate 100 are different, so that address information of the different driver circuits MIC is different.

In some examples, data signals Data received by data pins DataP of the different driver circuits MIC are a same signal. The data signal Data includes a plurality of signal groups, and the plurality of signal groups are in a one-to-one correspondence with the plurality of driver circuits MIC included in the array substrate 100. Each signal group includes address information and luminance information both corresponding to a respective driver circuit MIC. Since each driver circuit MIC is coupled to at least two device groups EC, the luminance information corresponding to each driver circuit MIC may include luminance information corresponding to the at least two device groups EC.

For example, in a process that the data pin DataP receives the data signal Data, the logic control component CTR of each driver circuit MIC may compare the address information of the driver circuit MIC with the address information in the data signal Data. In the case where the address information of the driver circuit MIC matches the address information in the data signal Data (for example, the address information of the two are the same), the logic control component CTR may acquire a signal group to which the address information belongs from the data signal Data and acquire the luminance information from the signal group, and thereby generate the driving control signal according to the luminance information.

In some examples, the logic control component CTR may include a decoder. The decoder may decode the data signal Data to acquire the address information and the luminance information in the data signal Data.

In some embodiments, the data signal Data may include a first data sub-signal Data1 and the second data sub-signal Data2. The address information includes first address information located in the first data sub-signal Data1 and second address information located in the second data sub-signal Data2. The luminance information includes amplitude information located in the first data sub-signal and duty ratio information located in the second data sub-signal.

Here, as for processes that the logic control component CTR receives the first data sub-signal and the second data sub-signal Data2 according to the clock signal CLK, reference may be made to the description in some of the above embodiments, and details will not be repeated here.

For example, the data pins DataP of the different driver circuits MIC receive a same first data sub-signal Data1, the first data sub-signal Data1 may include a plurality of first signal groups, and the plurality of first signal groups are in a one-to-one correspondence with the plurality of driver circuits MIC included in the array substrate 100. Each first signal group includes first address information and amplitude information both corresponding to a respective driver circuit MIC. Since each driver circuit MIC is coupled to at least two device groups EC, amplitude information corresponding to each driver circuit MIC may include amplitude information corresponding to the at least two device groups EC.

For example, the data pins DataP of the different driver circuits MIC receive a same second data sub-signal Data2, the second data sub-signal Data2 may include a plurality of second signal groups, and the plurality of second signal groups are in a one-to-one correspondence with the plurality of driver circuits MIC included in the array substrate 100. Each second signal group includes second address information and duty ratio information both corresponding to a respective driver circuit MIC. Since each driver circuit MIC is coupled to at least two device groups EC, duty ratio information corresponding to each driver circuit MIC may include duty ratio information corresponding to the at least two device groups EC.

For example, the first address information and the second address information may be a same type of information. The amplitude information and the duty ratio information are different types of information. Therefore, the amplitude information and the duty ratio information may be respectively transmitted to the data pin DataP.

For example, since the luminance of the functional element FE is jointly determined by the amplitude and the duration of the current received thereby, the luminance information in the data signal Data may include amplitude information and duty ratio information of the current. The amplitude information of the current may represent the amplitude of the current received by the functional element FE, and the duty ratio information may represent both a frequency of the current received by the functional element FE, and a sub-duration of receiving the current each time. It will be understood that, in a work cycle of the driver circuit MIC, the duration of the current received by the functional element FE is a sum of a plurality of sub-durations.

In some examples, the logic control component CTR is further configured to: compare the first address information with the address information of the driver circuit MIC, and generate, in a case where the first address information matches the address information of the driver circuit MIC, an amplitude signal according to the amplitude information to control the amplitude of the electrical signal flowing through the output pin OutP; and compare the second address information with the address information of the driver circuit MIC, and generate, in a case where the second address information matches the address information of the driver circuit MIC, a duty ratio selection signal according to the duty ratio information to control the duration of the electrical signal flowing through the output pin. That is, the driving control signal may include the amplitude signal and the duty ratio selection signal.

For example, in the process that the data pin DataP receives the first data sub-signal Data1, the logic control component CTR of each driver circuit MIC may compare the address information of the driver circuit MIC with the first address information in the first sub-data signal Data1. In the case where the address information of the driver circuit MIC matches the first address information in the first sub-data signal Data1 (for example, the address information of the two are the same), the logic control component CTR may acquire a first signal group to which the first address information belongs from the first data sub-signal Data1 and acquire the amplitude information from the first signal group, and in turn generate the amplitude signal according to the amplitude information. The amplitude signal may determine the amplitude of the electrical signal flowing through the output pin OutP, thereby determining an amplitude of an electrical signal (i.e., a current) transmitted to the functional element FE.

For example, in the process that the data pin DataP receives the second data sub-signal Data2, the logic control component CTR of each driver circuit MIC may compare the address information of the driver circuit MIC with the second address information in the second data sub-signal Data2. In the case where the address information of the driver circuit MIC matches the second address information in the second data sub-signal Data2 (for example, the address information of the two are the same), the logic control component CTR may acquire a second signal group to which the second address information belongs from the second data sub-signal Data2 and acquire the duty ratio information from the second signal group, and in turn generate the duty ratio selection signal according to the duty ratio information. The duty ratio selection signal may determine both a frequency of the electrical signal (i.e., the current) flowing through the output pin OutP, and a duration that the current flows through the output pin OutP each time, thereby determining a frequency of a current transmitted to the functional element FE and a duration of transmitting the current to the functional element FE each time.

In some embodiments, as shown in FIGS. 1 to 4, the plurality of pins P in the driver circuit MIC further include a grounding pin GNDP. The grounding pin GNDP is configured to receive a grounding voltage signal.

In some examples, the grounding pin GNDP is located in a loop of each output signal, and the grounding voltage signal received by the grounding pin GNDP may serve as a reference basis of each output signal.

In some examples, as shown in FIG. 1, the logic control component CTR may include a control module CLM and at least two modulation modules PWMM. The output pins OUTP included in the driver circuit MIC may be, for example, in a one-to-one correspondence with the modulation modules PWMM. Each modulation module PWMM may be coupled to a respective output pin OUTP.

For example, the control module CLM is configured to generate, according to the data signal Data (e.g., the second data sub-signal Data2), driving control signals (e.g., duty ratio selection signals) that are in a one-to-one correspondence with the modulation modules PWMM. The driving control signal is used for controlling turn-on or turn-off of a respective modulation module PWMM, so as to control a respective output pin OutP to be connected to or disconnected to the grounding pin GNDP, thereby achieving the control of the device group EC.

For example, the respective modulation module PWMM is controlled by the driving control signal, so that a signal flowing through the modulation module PWMM, an output pin OutP coupled to the modulation module PWMM and a device group EC coupled to the output pin OutP is a pulse width modulation signal; the driving control signal may control a duration of a current flowing through the output pin OutP and the device group EC by modulating the pulse width modulation signal (e.g., adjusting a duty ratio of the pulse width modulation signal).

For example, as shown in FIGS. 1 to 4, the driver circuit MIC may include four output pins OutP, which are a first output pin Out1, a second output pin Out2, a third output pin Out3 and a fourth output pin Out4. The logic control component CTR may include four modulation modules PWMM, which are a first modulation module PWMM1 coupled to the first output pin Out1, a second modulation module PWMM2 coupled to the second output pin Out2, a third modulation module PWMM3 coupled to the third output pin Out3, and a fourth modulation module PWMM4 coupled to the fourth output pin Out4. The control module CLM included in the logic control component CTR may generate a first driving control signal, a second driving control signal, a third driving control signal and a fourth driving control signal according to the data signal, and transmit the first driving control signal, the second driving control signal, the third driving control signal and the fourth driving control signal to the first modulation module PWMM1, the second modulation module PWMM2, the third modulation module PWMM3 and the fourth modulation module PWMM4, respectively.

For example, the first driving control signal may control turn-on or turn-off of the first modulation module PWMM1, so as to control the first output pin Out1 to be connected to or disconnected to the grounding pin GNDP. In a case where the first driving control signal controls the first modulation module PWMM1 to be turned on, the grounding pin GNDP, the first output pin Out1 and a device group EC coupled to the first output pin Out1 may constitute a signal loop, and the device group EC may be driven to work (e.g., emit light). In a case where the first driving control signal controls the first modulation module PWMM1 to be turned off, the signal loop is opened, and the device group EC stops working (e.g., stops emitting light). The first modulation module PWMM1 may modulate a current flowing through the device group EC under control of the first driving control signal to adjust a frequency of the current flowing through the device group EC and a duration that the current flows through the device group EC each time, so that the current flowing through the device group EC appears as a pulse width modulation signal. For example, the greater the frequency of the current flowing through the device group EC and the longer the duration that the current flows through the device group EC each time, the longer a duration of a current flowing through a functional element FE in the device group EC and the higher luminance of the functional element FE; conversely, the lower the luminance of the functional element FE.

Correspondingly, the second driving control signal may control turn-on or turn-off of the second modulation module PWMM2, so as to control the second output pin Out2 to be connected to or disconnected to the grounding pin GNDP. The second modulation module PWMM2 may modulate a current flowing through a device group EC coupled to the second output pin Out2 under control of the second driving control signal, so that the current flowing through the device group EC appears as a pulse width modulation signal. The third driving control signal may control turn-on or turn-off of the third modulation module PWMM3, so as to control the third output pin Out3 to be connected to or disconnected to the grounding pin GNDP. The third modulation module PWMM3 may modulate a current flowing through a device group EC coupled to the third output pin Out3 under control of the third driving control signal, so that the current flowing through the device group EC appears as a pulse width modulation signal. The fourth driving control signal may control turn-on or turn-off of the fourth modulation module PWMM4, so as to control the fourth output pin Out4 to be connected to or disconnected to the grounding pin GNDP. The fourth modulation module PWMM4 may modulate a current flowing through a device group EC coupled to the fourth output pin Out4 under control of the fourth driving control signal, so that the current flowing through the device group EC appears as a pulse width modulation signal.

For example, the first modulation module PWMM1 to the fourth modulation module PWMM4 may each include a switching element, which may include, for example, a transistor such as a metal oxide semiconductor field effect transistor (MOSFET) or a thin film transistor (TFT). The first driving control signal to the fourth driving control signal may be each a pulse width modulation signal, and the switching element may be turned on or turned off under control of the pulse width modulation signal.

Optionally, in the embodiments of the present disclosure, as shown in FIG. 1, each modulation module PWMM is coupled to the control module CLM. A coupling manner between the modulation module PWMM and the control module CLM may vary, which is not limited in the embodiments of the present disclosure.

For example, as shown in FIG. 1, the driver circuit MIC further includes a data bus DB. The modulation modules PWMM (e.g., the first modulation module PWMM1 to the fourth modulation module PWMM4) may be each coupled to the data bus DB and coupled to the control module CLM through the data bus DB. Of course, the modulation modules PWMM may be each directly coupled to the control module CLM through a line. Alternatively, the modulation modules PWMM may be each coupled to the control module CLM in other ways.

In some embodiments, as shown in FIGS. 1 to 4, the plurality of pins P in the driver circuit MIC further include an address pin Di_in and a relay pin Di_out. The address pin Di_in is configured to receive an address signal. The logic control component CTR is further configured to configure the address information of the driver circuit MIC according to the address signal, and generate a relay signal according to the address signal. The relay pin Di_out is configured to output the relay signal.

In some examples, the address signal received by the address pin Di_in corresponds to the driver circuit MIC to which the address pin Di_in belongs. The address information configured by the logic control component CTR in the driver circuit MIC according to the address signal is the address information configured by the driver circuit MIC in some of the above examples. The address information configured according to the address signal may represent the position of the driver circuit MIC in the array substrate 100.

For example, the address information may be a digital signal, and the digital signal may be modulated in the address signal. After the driver circuit MIC receives the address signal, the logic control component CTR may parse the address signal, and acquire and store the address information in the address signal. In addition, the logic control component CTR may increment (e.g., by 1 or another constant amount) the address information and modulate incremented address information (i.e., new address information) into a new relay signal, and the new relay signal serves as an address signal of another driver circuit MIC. Of course, the driver circuit MIC may use other different functions to generate new address information.

For example, the plurality of driver circuits MIC included in the array substrate 100 may be cascaded. As for a cascading manner of the plurality of driver circuits MIC, reference may be made to the description below, and details will not be repeated here. It will be noted that, with regard to the plurality of driver circuits MIC that are cascaded with one another, except a last driver circuit MIC, relay signals output by relay pins Di_out of remaining driver circuits MIC are each another address signal, and the relay signals are each loaded with address information and may serve as an address signal received by an address pin Di_in of a next driver circuit MIC. A relay pin Di_out of the last driver circuit MIC outputs a feedback signal (e.g., which is a high-level signal), and the feedback signal is not loaded with address information and may be transmitted to the controller circuit 1.

In some examples, as shown in FIG. 1, the logic control component CTR may further include a fifth modulation module PWMM5. The fifth modulation module PWMM5 may be coupled to the relay pin Di_out.

For example, the address signal received by the address pin Di_in may be transmitted to the control module CLM in the logic control component CTR. The control module CLM may generate a relay control signal according to the address signal, and transmit the relay control signal to the fifth modulation module PWMM5. The fifth modulation module PWMM5 may generate a relay signal in response to the relay control signal, and load the relay signal to the relay pin Di_out.

For example, the fifth modulation module PWMM5 may include a switching element, which may include, for example, a transistor such as a MOSFET or a TFT. The relay control signal may be a pulse width modulation signal, and the switching element may be turned on or turned off under control of the pulse width modulation signal. In a case where the switching element is turned on, the fifth modulation module PWMM5 may output a current or a voltage. In a case where the switching element is turned off, the fifth modulation module PWMM5 may not output the current or the voltage. In this way, the fifth modulation module PWMM5 may modulate the pulse width modulation signal as the relay signal.

Optionally, in the embodiments of the present disclosure, as shown in FIG. 1, the fifth modulation module PWMM5 is coupled to the control module CLM. A coupling manner between the fifth modulation module PWMM5 and the control module CLM may vary, which is not limited in the embodiments of the present disclosure.

For example, as shown in FIG. 1, the fifth modulation module PWMM5 may be coupled to the data bus DB and coupled to the control module CLM through the data bus DB. Of course, the fifth modulation module PWMM5 may be coupled to the control module CLM through a dedicated line. Alternatively, the fifth modulation module PWMM5 may be coupled to the control module in other ways.

Optionally, the first modulation module PWMM1 to the fifth modulation module PWMM5 are each coupled to the control module CLM through the data bus DB. In this way, the control module CLM may interact with the first modulation module PWMM1 to the fifth modulation module PWMM5 through the data bus D.

In some embodiments, as shown in FIGS. 1 to 4, the plurality of pins P in the driver circuit MIC further include a chip power supply pin VCCP. The chip power supply pin VCCP is configured to receive a power supply voltage signal used for driving the driver circuit MIC to work. The driver circuit MIC may have a plurality of circuits, and the plurality of circuits may work under driving of the power supply voltage signal.

In some examples, as shown in FIG. 1, the driver circuit MIC may include a power supply module PWRM. The power supply voltage signal received by the chip power supply pin VCCP may be transmitted to the power supply module PWRM. The power supply module PWRM may process the power supply voltage signal to allocate power to the plurality of circuits in the driver circuit MIC, so as to ensure a power supply of the driver circuit MIC.

In the above implementation manner, the single-channel driver circuit may reuse a same pin due to a limitation of the number of pins of the single-channel driver circuit. That is, in this implementation manner, the data signal is superimposed on the power supply voltage signal by the power line communication (PLC) protocol, so as to receive the power supply voltage signal superimposed with the data signal through the same pin. In this case, a voltage regulation module needs to be provided inside the driver circuit MIC, so that the voltage regulation module can be used for separating the data signal from the power supply voltage signal after the power supply voltage signal superimposed with the data signal is received. However, the voltage regulation module will occupy a certain area, thereby improve an area of the single-channel driver circuit. In addition, a level shift module needs to be provided inside the driver circuit MIC; since a level of the data signal needs to be higher than a lowest level of the power supply voltage signal, and a difference between a near end and a far end of the whole array substrate, a relatively high requirement for a driving current voltage of the level shift module is needed. As a result, a driving cost of the array substrate is improved.

However, in the driver circuit MIC provided in the embodiments of the present disclosure, the data pin DataP and the chip power supply pin VCCP are disposed separately, and the data signal Data and the power supply voltage signal are provided separately, so that the data pin DataP and the chip power supply pin VCCP independently receive the data signal Data and the power supply voltage signal, respectively. In this way, there is no need to provide the voltage regulation module and the level shift module inside the driver circuit MIC, which is conducive to reducing the area of the driver circuit MIC and reducing the driving cost of the array substrate 100. Moreover, currents of the data pin DataP and the chip power supply pin VCCP may be reduced, so as to optimize qualities of the data signal Data and the power supply voltage signal and reduce a risk that the power supply voltage signal stops working due to the difference between the near end and the far end of the whole array substrate 100 and the level of the data signal Data. In addition, with the above arrangement, it is possible to prevent a quality requirement for the power supply voltage signal from reducing due to the provision of a modulation circuit superimposing the data signal Data and the power supply voltage signal, which is conducive to reducing the driving cost of the array substrate 100.

It will be understood that, in some embodiments of the present disclosure, the data pin DataP, the clock pin CLKP, the output pin OutP, the address pin Di_in, the relay pin Di_out, the chip power supply pin VCCP and the grounding pin GNDP are examples of the plurality of pins P included in the driver circuit MIC, and types of pins included in the plurality of pins P are not limited thereto, which may be specifically set according to actual needs.

Figures 2, 3:
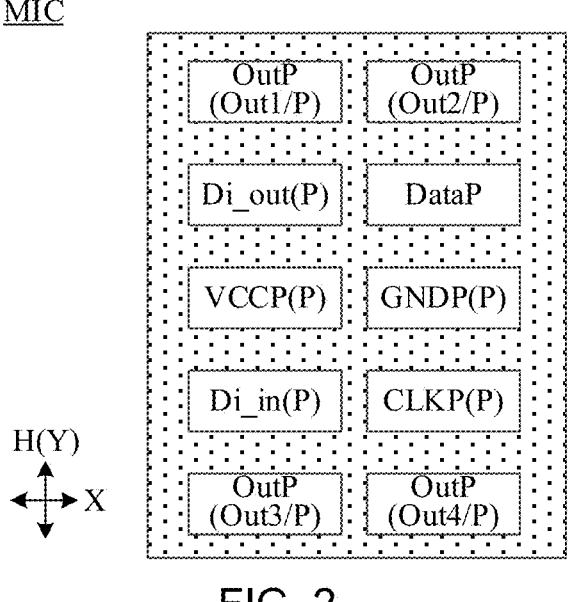
FIG. 2 is a structural diagram of another driver circuit, in accordance with some embodiments of the present disclosure.
FIG. 3 is a structural diagram of yet another driver circuit, in accordance with some embodiments of the present disclosure.
Figure 4:
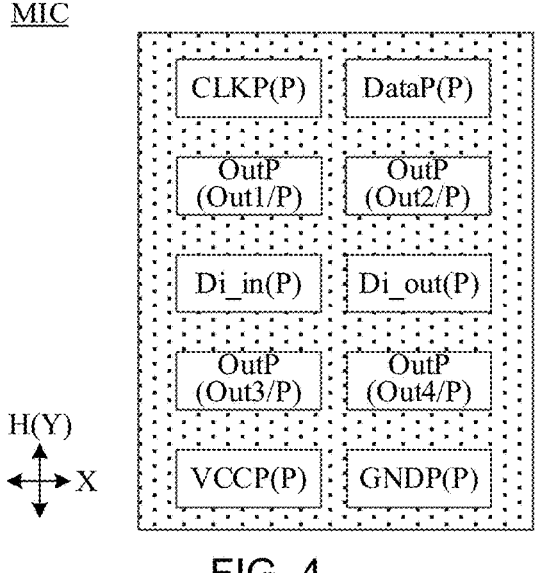
FIG. 4 is a structural diagram of yet another driver circuit, in accordance with some embodiments of the present disclosure.

In some embodiments, as shown in FIGS. 2 to 4, in a length direction H of the driver circuit MIC, the plurality of pins P included in the driver circuit MIC may be arranged in a plurality of rows. The number of pins in each row may be the same.

In this way, in a process of bonding the driver circuit MIC to the array substrate 100, it is possible to make force to which the driver circuit MIC is subjected relatively balanced, which ensures that a plane where the driver circuit MIC is located is substantially parallel to a plane where the array substrate 100 is located. As a result, a situation that the driver circuit MIC is skew is avoided, thereby ensuring the bonding yield of the driver circuit MIC.

In some examples, as shown in FIGS. 2 to 4, the number of the plurality of pins P included in the driver circuit MIC may be an even number. In the length direction of the driver circuit MIC, the plurality of pins P are arranged in two rows, and the number of pins in each row is the same.

The plurality of pins P are arranged in the two rows, so that the two rows of pins may be respectively arranged on two opposite edges of the driver circuit MIC. In this way, in the process of bonding the driver circuit MIC to the array substrate 100, it is convenient for observing and detecting a situation of bonding, thereby reducing a difficulty of bonding, and improving the bonding yield. In addition, with this arrangement, it is possible to make the force to which the driver circuit MIC is subjected relatively balanced, so as to avoid the situation that the driver circuit MIC is skew in the process of bonding the driver circuit MIC.

In some examples, as shown in FIGS. 2 to 4, in a same driver circuit MIC, the plurality of pins P may include the data pin DataP, the clock pin CLKP, the address pin Di_in, the relay pin Di_out, the chip power supply pin VCCP, the grounding pin GNDP and the output pins OutP. The number of data pins DataP may be one, the number of clock pins CLKP may be one, the number of address pins Di_in may be one, the number of relay pins Di_out may be one, the number of chip power supply pins VCCP may be one, and the number of grounding pins GNDP may be one. Thus, the number of output pins OutP may be the even number.

For example, the number of output pins OutP may be two, four, six, etc.

For example, the pins in each row include the output pin OutP. In this way, the output pins OutP may be arranged on the two sides of the driver circuit MIC, which is convenient for coupling each output pin OutP to a respective device group EC, and conducive to a uniform distribution of the device groups EC. As a result, a distance between each output pin OutP and the respective device group EC is reduced, and a difficulty of wiring is reduced. In addition, distribution positions of the output pins OutP are set with this arrangement, so that a mutual electrical disturbance caused by a relatively small distance between the output pins OutP may be avoided.

For example, as shown in FIGS. 2 to 4, the number of output pins OutP is four. The pins in each row include two output pins OutP, and at least one pin P of the plurality of pins P except all the output pins OutP is disposed between the two output pins OutP.

For example, as shown in FIG. 4, in a same row of pins P, one pin P of the plurality of pins P except all the output pins OutP may be disposed between the two output pins OutP. In this case, the two output pins OutP may be both located in the middle of the driver circuit MIC. Alternatively, in the two output pins OutP, one output pin OutP may be located in the middle of the driver circuit MIC, and the other output pin OutP may be located at a top corner of the driver circuit MIC.

For another example, as shown in FIGS. 2 and 3, in the same row of pins P, three pins P of the plurality of pins P except all the output pins OutP may be disposed between the two output pins OutP. In this case, the two output pins OutP may be each located at a top corner of the driver circuit MIC.

Positions of the output pins OutP are set with the above arrangement, which is conducive to further improving the distribution uniformity of the device groups EC, and reducing the difficulty of wiring. In addition, the distribution positions of the output pins OutP are set with this arrangement, so that the mutual electrical disturbance caused by the relatively small distance between the output pins OutP may be avoided.

It will be noted that an arrangement order of the data pin DataP, the clock pin CLKP, the address pin Di_in, the relay pin Di_out, the chip power supply pin VCCP and the grounding pin GNDP is not limited in the embodiments of the present disclosure, which may be specifically set according to actual needs.

For example, as shown in FIGS. 2 and 3, the address pin Di_in and the relay pin Di_out may be located in a same row of pins P. Of course, as shown in FIG. 4, the address pin Di_in and the relay pin Di_out may be located in different rows of pins P. An arrangement manner of the address pin Di_in and the relay pin Di_out may be determined according to a cascading relationship of the driver circuits MIC. As for the cascading relationship of the driver circuits MIC, reference may be made to the description below, and details will not be repeated here.

For example, the chip power supply pin VCCP and the data pin DataP may be located in different rows of pins.

For example, as shown in FIGS. 2 and 3, in a same driver circuit MIC, one row of pins P may include the output pin OutP (e.g., the first output pin Out1), the relay pin Di_out, the chip power supply pin VCCP, the address pin Di_in and the output pin OutP (e.g., the third output pin Out3) that are arranged in sequence, and the other row of pins P may include the output pin OutP (e.g., the second output pin Out2), the data pin DataP, the grounding pin GNDP, the clock pin CLKP and the output pin OutP (e.g., the fourth output pin Out4) that are arranged in sequence.

For another example, as shown in FIG. 4, in a same driver circuit MIC, one row of pins P may include the clock pin CLKP, the output pin OutP (e.g., the first output pin Out1), the address pin Di_in, the output pin OutP (e.g., the third output pin Out3) and the chip power supply pin VCCP that are arranged in sequence, and the other row of pins P may include the data pin DataP, the output pin OutP (e.g., the second output pin Out2), the relay pin Di_out, the output pin OutP (e.g., the fourth output pin Out4) and the grounding pin GNDP that are arranged in sequence.

In some examples, a distance between the pin P of the driver circuit MIC and an edge of the driver circuit MIC may be in a range from 25 μm to 40 μm. In this way, it is possible to enable the driver circuit MIC to have a relatively small area, and it is also possible to reduce a difficulty of manufacturing the driver circuit.

In the embodiments of the present disclosure, as shown in FIGS. 2 to 4, the length direction H of the driver circuit MIC may be referred to as a first direction Y, and a width direction of the driver circuit MIC may be referred to as a second direction X.

For example, a distance between two adjacent pins P in a same row of pins may be equal to 0.8 to 1.2 times a dimension of the pin P in the first direction Y. In this way, it is possible to increase a process window during bonding of the pin P, so as to reduce poor bonding caused by an alignment deviation. Furthermore, it is possible to enable the distance between the two adjacent pins P to be relatively small, which prevents the area of the driver circuit MIC from being improved, and reduces the cost of the array substrate 100.

For example, the dimension of the pin P of the driver circuit MIC in the first direction Y may be in a range from 80 μm to 120 μm. In the same row of pins, a distance between the two adjacent pins P in the first direction Y may be in a range from 80 μm to 100 μm.

For example, a distance between two adjacent rows of pins may be equal to 0.8 to 1.2 times a dimension of the pin P in the second direction X. In this way, it is possible to increase the process window during bonding of the pin P, so as to reduce the poor bonding caused by the alignment deviation. Furthermore, it is possible to enable the distance between the two adjacent pins P to be relatively small, which prevents the area of the driver circuit MIC from being improved, and reduces the cost of the array substrate 100.

For example, the dimension of the pin P of the driver circuit MIC in the second direction X may be in a range from 120 μm to 150 μm. The distance between the two adjacent rows of pins may be in a range from 130 μm to 170 μm.

Figure 5:
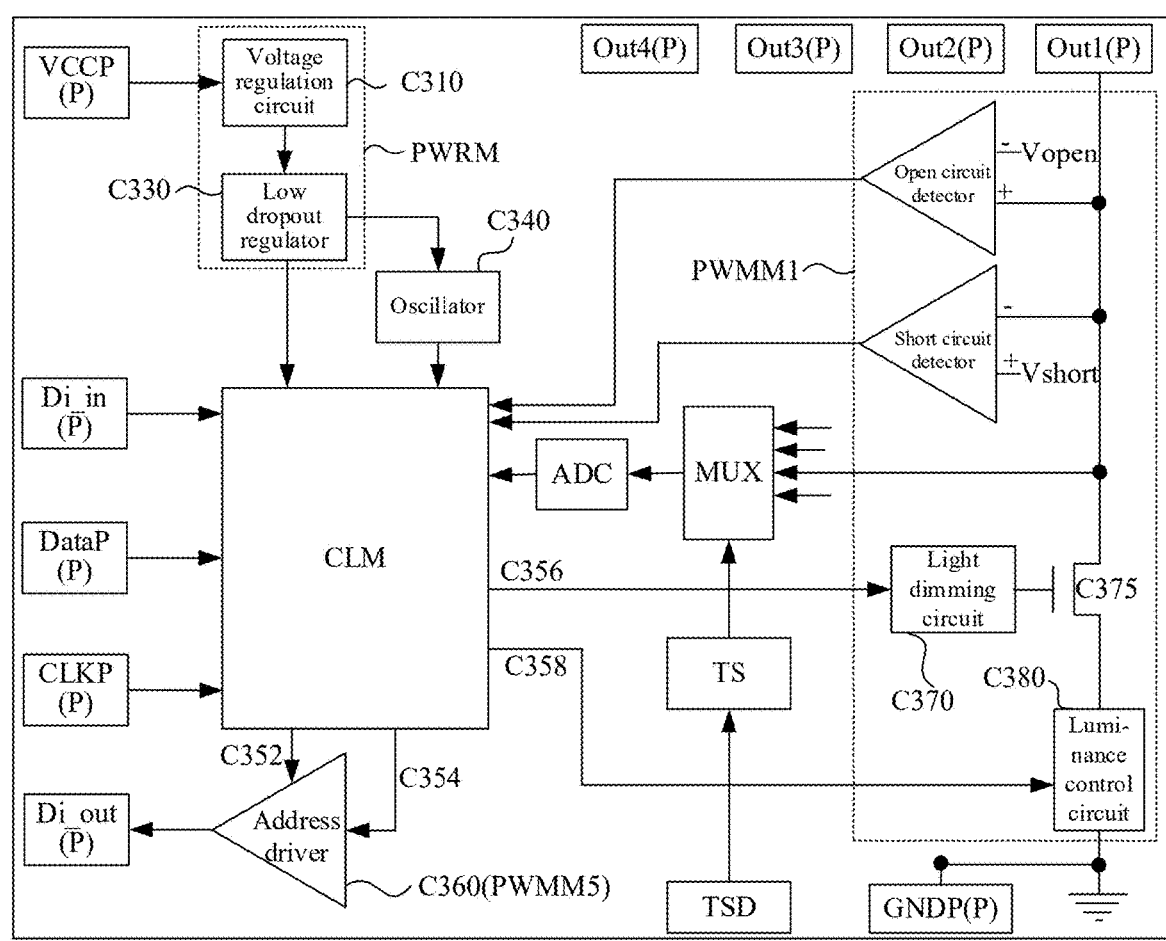
FIG. 5 is a structural diagram of yet another driver circuit, in accordance with some embodiments of the present disclosure.

FIG. 5 is a structural schematic diagram of the driver circuit MIC. The driver circuit MIC includes four output pins OutP. In addition, the figure only shows the first modulation module PWMM1 coupled to the first output pin Out1. As for structures of the second modulation module PWMM2 coupled to the second output pin Out2 to the fourth modulation module PWMM4 coupled to the fourth output pin Out4, reference may be made to the first modulation module PWMM1.

Hereinafter, a structure and a function of the driver circuit MIC will be schematically described with reference to FIG. 5.

In some examples, as shown in FIG. 5, the driver circuit MIC may further include a voltage regulation circuit C310, a low dropout regulator C330 and an oscillator C340.

For example, the power supply voltage signal received by the chip power supply pin VCCP may be transmitted to the voltage regulation circuit C310. The voltage regulation circuit C310 may regulate the power supply voltage signal to obtain a direct current component of the power supply voltage signal and generate a service voltage according to the direct current component. The voltage regulation circuit C310 may provide the service voltage for the low dropout regulator C330. The low dropout regulator C330 may convert the service voltage to a relatively stable direct current voltage (i.e., reduce a voltage step by step) and transmit the direct current voltage to the oscillator C340, the control module CLM or other accessories (which are not shown), so as to supply power for the oscillator C340, the control module CLM or the other accessories (which are not shown).

For example, the voltage regulation circuit C310 may include a first-order resistance-capacitance (RC) filter followed with a source follower. The relatively stable direct current voltage may be 1.8 volts. The oscillator C340 may provide a clock signal, and a maximum frequency of the clock signal may be, for example, approximately 10 MHz. It will be noted that the clock signal provided in the oscillator C340 is different from the clock signal CLK received by the clock pin CLKP.

For example, the power supply module PWRM in the driver circuit MIC may include, for example, the voltage regulation circuit C310 and the low dropout regulator C330.

In some examples, as shown in FIG. 5, the driver circuit MIC may further include the control module CLM.

For example, the control module CLM may include a data link circuit and a control logic module circuit. The data link circuit is configured to be coupled to circuits/modules or structures outside the control module CLM. For example, the data link circuit may be, for example, coupled to the address pin Di_in, the data pin DataP and the data bus DB. The control logic module circuit is configured to: receive external signals (e.g., the address signal received by the address pin Di_in, the data signal Data received by the data pin DataP, the clock signal CLK received by the clock pin CLKP, the direct current voltage output by the low dropout regulator C330 and the clock signal output by the oscillator C340) through the data link circuit; and generate the driving control signals and output the driving control signals (e.g., output the first driving control signal to the fifth driving control signal) through the data link circuit.

In some examples, as shown in FIG. 5, the driver circuit MIC may further include an address driver C360.

For example, the address signal received by the address pin Di_in may be transmitted to the control module CLM, and the control module CLM may acquire and store the address information in the address signal. The control module CLM may increment the address information, modulate the incremented address information (i.e., the new address information) into the new relay signal C354, and transmit the new relay signal C354 to the address driver C360. The control module CLM may also output an enable signal C352. In an address configuration phase, the control module CLM may activate the enable signal C352 to enable the address driver C360, and the address driver C360 may buffer the new relay signal C354 to the relay pin Di_out. In a device control phase and a driving configuration phase, the control module CLM deactivates the enable signal C352, and the address driver C360 has a tri-state output, so as to effectively decouple the new relay signal C354 from the relay pin Di_out. As for the address configuration phase, the device control phase and the driving configuration phase, reference may be made to the description below, and details will not be repeated here.

For example, the fifth modulation module PWMM5 may include the address driver C360.

In some examples, as shown in FIG. 5, the driver circuit MIC may further include a light dimming circuit C370, a transistor C375 and a luminance control circuit C380. Of course, the driver circuit MIC may include additional, fewer or different components.

For example, the control module CLM may output a pulse width modulation (PWM) clock selection signal C356 and a maximum current signal C358. In the address configuration phase, the control module CLM may control the light dimming circuit C370 to turn off the transistor C375, thereby effectively cutting off a current path from the device group EC. In the device control phase, the PWM clock selection signal C356 is used by the light dimming circuit C370 to control a duty ratio of PWM dimming. Based on a selected duty ratio, the light dimming circuit C370 controls a frequency at which the transistor C375 is turned on or turned off, and a duration of which the transistor C375 is turned on. In a period that the transistor C375 is turned on, a current path from the first output pin Out1 (which is coupled to the device group EC) to the grounding pin GNDP through the transistor C375 is formed, and the luminance control circuit C380 transmits driving currents flowing through the first output pin Out1. In a period that the transistor C375 is turned off, the current path is cut off to prevent the currents from flowing through the device group EC. In a case where the transistor C375 is in a turn-on state, the luminance control circuit C380 receives the maximum current signal C358 from the control module CLM and controls the current flowing through the first output pin Out1. In the device control phase, the control module CLM controls both a duty ratio of the light dimming circuit C370 and the maximum current signal C358 of the luminance control circuit C380 to set the functional element FE in the device group EC to have desired luminance.

For example, the first modulation module PWMM1 may include the light dimming circuit C370, the transistor C375 and the luminance control circuit C380. The amplitude signal may refer to the maximum current signal C358, and the duty ratio selection signal may refer to the PWM clock selection signal C356.

In some examples, the driver circuit MIC may further include a voltage-controlled constant current circuit (which is not shown in the figures). An input reference voltage and an input reference current of the voltage-controlled constant current circuit may be both generated by the power supply voltage signal received at the chip power supply pin VCCP. The voltage-controlled constant current circuit may be coupled to the luminance control circuit C380.

In some examples, as shown in FIG. 5, the first modulation module PWMM1 further includes a short circuit detector and an open circuit detector. The open circuit detector is constituted by operational amplifiers connected in a form of a virtual open circuit and used for detecting whether an open circuit occurs between the device group EC and the driver circuit MIC. A terminal Vopen may be a floating signal terminal. The short circuit detector is constituted by operational amplifiers connected in a form of a virtual short circuit and used for detecting whether a short circuit occurs between the device group EC and the driver circuit MIC. A potential of a terminal Vshort may be equal to a potential of a signal received by another terminal of the device group EC.

For example, information such as a short circuit and/or an open circuit between each device group EC and a respective driver circuit MIC is collected in a control module CLM in the driver circuit MIC; and then, the information passes through a relay pin Di_out in the driver circuit MIC (for example, the information is appended behind a new relay signal C354 in sequence according to an encoding rule), and the information is transmitted stage by stage until the information is output by the relay pin Di_out of the last driver circuit MIC of the driver circuits MIC that are cascaded with one another, and fed back to the controller circuit 1. The controller circuit 1 may determine an abnormality of the driver circuit MIC or the device group EC in time in response to feedback information.

For example, in a power-on phase and/or the address configuration phase, cyclic redundancy check (CRC) information may be output by the relay pin Di_out of the last driver circuit MIC of the driver circuits MIC that are cascaded with one another, and fed back to the controller circuit 1 in the above manner. The controller circuit 1 may determine the abnormality of the driver circuit MIC or the device group EC in time in response to feedback information.

In some examples, as shown in FIG. 5, the driver circuit MIC may further include a data selector MUX and an analog-to-digital converter ADC. In a case where signal loops are respectively constituted by the output pins OutP and respective device groups EC connected thereto in the driver circuit MIC, electrical signals of the signal loops may be transmitted to the data selector MUX, and sequentially processed by the analog-to-digital converter ADC in a time-division manner and then transmitted to the control module CLM; after that, the electrical signals of the signal loops pass through the relay pin Di_out in the driver circuit MIC (for example, the electrical signals of the signal loops are appended behind the new relay signal C354 in sequence according to the encoding rule); and then, the electrical signals are transmitted stage by stage until the electrical signals are output by the relay pin Di_out of the last driver circuit MIC of the driver circuits MIC that are cascaded with one another, and fed back to the controller circuit 1. The controller circuit 1 may regulate a level of a signal (e.g., a level of a device power supply voltage signal VLED) output thereby in response to feedback information, thereby reducing power consumption of the array substrate 100.

In some examples, as shown in FIG. 5, the driver circuit MIC may further include a thermal shutdown delay sensor TSD and a thermal shutdown delay controller TS. The thermal shutdown delay sensor TSD is used for detecting an internal temperature of the driver circuit MIC. If the internal temperature of the driver circuit MIC reaches a preset protection temperature (which is generally set in a range from 150° C. to 170° C.), the thermal shutdown delay controller TS works to stop an output of the driver circuit MIC, so as to reduce power consumption of the driver circuit MIC. As a result, the internal temperature of the driver circuit MIC decreases. If the internal temperature of the driver circuit MIC decreases to a preset restart temperature (the preset restart temperature is equal to the protection temperature minus a delay temperature), the output of the driver circuit MIC is restarted. The delay temperature is generally set in a range from 15° C. to 30° C. The thermal shutdown delay controller TS may be coupled to the data selector MUX, so that abnormality information may be fed back to the control module CLM by the data selector MUX, so as to control a working state of the driver circuit MIC.

Hereinafter, a method of driving the driver circuit MIC will be schematically described by taking a structure of the driver circuit MIC shown in FIG. 1 as an example in conjunction with a timing diagram shown in FIG. 6.

In some embodiments, the method of driving the driver circuit MIC includes S100 to S300.

In S100, the clock pin CLKP in the driver circuit MIC receives the clock signal CLK.

In S200, the logic control component CTR in the driver circuit MIC controls the data pin DataP in the driver circuit MIC to receive the data signal Data in the period of the active level of the clock signal CLK.

In S300, the logic control component CTR generates the driving control signal corresponding to each output pin OutP in the driver circuit MIC according to the data signal Data, so as to control the electrical signal flowing through the output pin OutP.

In some examples, the data signal includes the address information and the luminance information.

For example, in S300, generating the driving control signal corresponding to each output pin OutP in the driver circuit MIC according to the data signal includes: comparing, by the logic control component CTR, the address information in the data signal Data with the address information of the driver circuit MIC; and acquiring, by the logic control component CTR, the luminance information in the data signal Data in the case where the address information in the data signal Data matches the address information of the driver circuit MIC; and generating, by the logic control component CTR, the driving control signal according to the luminance information in the data signal Data.

Here, as for the description of the clock signal CLK, the data signal Data and the driving control signal, reference may be made to the description in some of the above embodiments, and details will not be repeated here.

Beneficial effects that can be achieved by the method of driving the driver circuit MIC provided in some embodiments of the present disclosure are the same as beneficial effects that can be achieved by the driver circuit MIC provided in some of the above embodiments, and details will not be repeated here.

Figure 7:
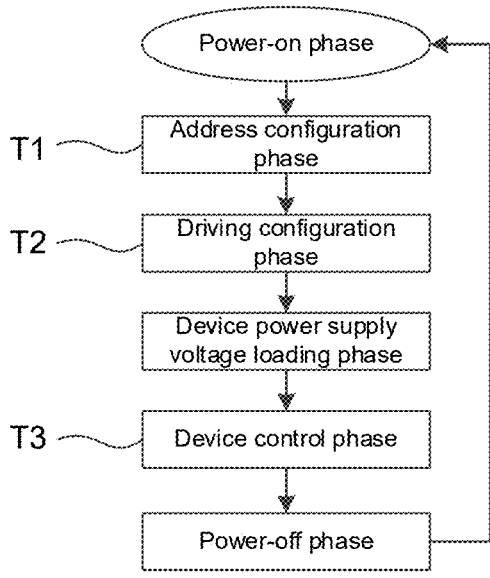
FIG. 7 is a flow diagram of a driving method of a driver circuit, in accordance with some embodiments of the present disclosure.

It will be noted that the method of driving the driver circuit MIC may include a plurality of phases, as shown in FIG. 7, which may include, for example, the power-on phase, the address configuration phase T1, the driving configuration phase T2, the device control phase T3 and a power-off phase.

In the power-on phase, the chip power supply pin VCCP in the driver circuit MIC may receive the power supply voltage signal.

For example, the controller circuit 1 may provide the power supply voltage signal and load the power supply voltage signal to the chip power supply pin VCCP, thereby provide the power supply voltage signal for the driver circuit MIC through the chip power supply pin VCCP, which is convenient for supplying power for the driver circuit MIC. In this case, the driver circuit MIC is in a power-on state.

Optionally, the controller circuit 1 may load the power supply voltage signal to the plurality of driver circuits MIC included in the array substrate 100 at the same time, thereby enabling the plurality of driver circuits MIC in the array substrate 100 to be powered on at the same time.

Optionally, the array substrate 100 may serve as, for example, a lamp panel in the display apparatus 1000 for providing a light source. In a process that the array substrate cooperates with a passive display panel in the display apparatus 1000 to realize display, after the display apparatus 1000 is switched on to enable an external circuit (e.g., a circuit board driving the array substrate 100) to be powered on, the external circuit may load the power supply voltage signal to the driver circuit MIC, thereby enabling power-on of the driver circuit MIC and switch-on of the display apparatus 1000 to be kept synchronous. In some cases, after the display apparatus 1000 is turned on, the controller circuit 1 loads the power supply voltage signal to the driver circuit MIC, so that the passive display panel may display images at intervals after the driver circuit MIC is powered on, which is not limited herein.

In the address configuration phase T1, the address pin Di_in in the driver circuit MIC receives the address signal. According to the address signal, the logic control component CTR in the driver circuit MIC configures the address information of the driver circuit MIC to which the address signal belongs, and generates and outputs the relay signal. The relay signal is capable of serving as the address signal of the next driver circuit MIC (i.e., a subsequent driver circuit MIC).

For example, for the driver circuits MIC that are cascaded with one another, an address signal received by a first driver circuit may be provided by the controller circuit 1. Address signals received by remaining driver circuits MIC are each a relay signal output by a relay pin Di_out of a previous driver circuit MIC.

For example, as shown in FIG. 6, in the driver circuits MIC that are cascaded with one another, Di_in(n) represents an address signal received by an address pin Di_in of an n-th driver circuit MIC, and Di_out(n) represents a relay signal output by a relay pin Di_out of the n-th driver circuit MIC. In the address configuration phase T1, the relay signal output by the n-th driver circuit MIC serves as an address signal of an (n+1)-th driver circuit MIC, where n is a positive integer.

In this phase, in the driver circuits MIC that are cascaded with one another, all driver circuits MIC configure respective address information in sequence according to the cascading order until the last driver circuit MIC configures respective address information, so as to achieve configurations of the respective address information of all driver circuits MIC.

It will be noted that, as shown in FIG. 6, FB represents a feedback signal output by the last driver circuit MIC, and the feedback signal may be transmitted to the controller circuit 1, thereby indicating that the configurations of the respective address information of all driver circuits MIC are completed. The feedback signal output by the last driver circuit MIC is, for example, not loaded with address information.

The driving configuration phase T2 includes an initialization configuration phase T21 and an amplitude configuration phase T22 that are performed in sequence, as shown in FIG. 6, Data represents a signal received by the data pin DataP, and CLK represents a signal received by the clock pin CLKP. The clock signal CLK includes the third clock sub-signal CLK3 and the first clock sub-signal CLK1 that appear in sequence. The data signal Data includes the third data sub-signal Data3; the address information in the data signal Data further includes third address information located in the third data sub-signal Data3, and the luminance information further includes initialization information located in the third data sub-signal Data3. The data signal Data further includes the first data sub-signal Data1; the address information in the data signal Data further includes the first address information located in the first data sub-signal Data1, and the luminance information further includes current amplitude information located in the first data sub-signal Data1. The third clock sub-signal CLK3 and the third data sub-signal Data3 both correspond to the initialization configuration phase T21, and the first clock sub-signal CLK1 and the first data sub-signal Data1 both correspond to the amplitude configuration phase T22.

In the initialization configuration phase T21, the clock pin CLKP of the driver circuit MIC receives the third clock sub-signal CLK3. After the logic control component CTR performing detections and determines on the third clock sub-signal CLK3, the logic control component CTR may control the data pin DataP to receive the third data sub-signal Data3 in a period of an active level of the third clock sub-signal CLK3. The logic control component CTR may acquire the third address information from the third data sub-signal Data3, and compare the third address information with the address information of the driver circuit MIC to which the third address information belongs. In a case where the third address information matches the address information of the driver circuit MIC to which the third address information belongs, the logic control component CTR may control the data pin DataP to acquire respective initialization information, so as to perform initialize configuration on the driver circuit MIC.

For example, at least some of the driver circuits MIC may receive both the third clock sub-signal CLK3 and the third data sub-signal Data3 at the same time, so as to perform initialize configuration at the same time. In this way, it is conducive to reducing time for performing initialize configuration on the driver circuits MIC.

In the amplitude configuration phase T22, the clock pin CLKP of the driver circuit MIC receives the first clock sub-signal CLK1. After the logic control component CTR performing detections and determines on the first clock sub-signal CLK1, the logic control component CTR may control the data pin DataP to receive the first data sub-signal Data1 in a period of an active level of the first clock sub-signal CLK1. The logic control component CTR may acquire the first address information from the first data sub-signal Data1, and compare the first address information with address information of the driver circuit MIC to which the first address information belongs. In a case where the first address information matches the address information of the driver circuit MIC to which the first address information belongs, the logic control component MIC may control the data pin DataP to acquire current amplitude information and generate the amplitude signal according to the amplitude information.

For example, at least some of the driver circuits MIC may receive both the first clock sub-signal CLK1 and the first data sub-signal Data1 at the same time, so that the some of the driver circuits MIC may generate respective amplitude signals at the same time. In this way, it is conducive to reducing time for generating amplitude signals.

For example, amplitude information respectively acquired by logic control components CTR of different driver circuits MIC may be the same or different, which may be determined according to working states of respective device groups EC.

For example, the logic control components CTR of the different driver circuits MIC acquire the same amplitude information. Correspondingly, the logic control components CTR of the different driver circuits MIC generate a same amplitude signal. Optionally, the amplitude signal corresponds to, for example, the maximum current signal C358.

In the device control phase T3, the clock signal CLK further includes the second clock sub-signal CLK2. The data signal Data further includes the second data sub-signal Data2. The address information in the data signal Data further includes the second address information located in the second data sub-signal Data2. The luminance information further includes the duty ratio information located in the second data sub-signal Data2.

The clock pin CLKP of the driver circuit MIC receives the second clock sub-signal CLK2. After the logic control component CTR performing detections and determines on the second clock sub-signal CLK2, the logic control component CTR may control the data pin DataP to receive the second data sub-signal Data2 in a period of an active level of the second clock sub-signal CLK2. The logic control component CTR may acquire the second address information from the second data sub-signal Data2, and compare the second address information with address information of the driver circuit MIC to which the second address information belongs. In a case where the second address information matches the address information of the driver circuit MIC to which the second address information belongs, the logic control component CTR may control the data pin DataP to acquire the duty ratio information, and generate a duty ratio selection signal according to the duty ratio information.

For example, duty ratio information respectively acquired by logic control components CTR of different driver circuits MIC may be the same or different, which may be determined according to working states of respective device groups EC.

For example, in a case where the different driver circuits MIC generate the same amplitude signal, the working states of the respective device groups EC may be determined by respective duty ratio selection signals. In this way, second data sub-signals Data2 are encoded, and different duty ratio information is respectively loaded in the second data sub-signals Data2, so that the different driver circuits MIC may generate different duty ratio selection signals according to respective duty ratio information. As a result, device groups EC respectively coupled to the different driver circuits MIC have different working states (e.g., different display luminance).

In the power-off phase, the driver circuit MIC is in a power-off state and does not work.

Optionally, transmission of the power supply voltage signal may be stopped, so that the driver circuit MIC is in the power-off state. Further optionally, in a case where the external circuit in the display apparatus 1000 is powered off, the driver circuit MIC is powered off. In other words, in a case where the display apparatus 1000 is switched off, the driver circuit MIC may be powered off to be in the power-off phase.

It will be understood that before the device control phase T3, the method of driving the driver circuit MIC may further include a device power supply voltage loading phase. In this phase, a device power supply voltage signal (which is represented as VLED in FIG. 6) may be loaded to the device groups EC. In this way, the device groups EC may work under control of the driver circuit MIC. For example, the functional elements FE may emit light under the control of the driver circuit MIC.

Hereinafter, the schematic description of the structure of the array substrate 100 will be continued with reference to the accompanying drawings.

In the array substrate 100 provided in some embodiments of the present disclosure, an arrangement manner of the plurality of driver circuits MIC included in the array substrate 100 varies, which may be set according to actual needs and is not limited in the embodiments of the present disclosure.

In some examples, as shown in FIGS. 8 to 11, the plurality of driver circuits MIC may be arranged in a plurality of columns in the second direction X. The number of driver circuits MIC included in each column of driver circuits MIC may be the same or different.

In some examples, as shown in FIGS. 8 to 11, the plurality of driver circuits MIC may be arranged in a plurality of rows in the first direction Y. The number of driver circuits MIC included in each row of driver circuits may be the same or different.

In the embodiments of the present disclosure, an arrangement manner of the plurality of device groups EC included in the array substrate 100 varies, which may be set according to actual needs and is not limited in the embodiments of the present disclosure.

In some examples, as shown in FIGS. 8 to 11, the plurality of device groups EC may be arranged in a plurality of columns in the second direction X. The number of device groups EC included in each column of device groups EC may be the same or different.

In some examples, as shown in FIGS. 8 to 11, the plurality of device groups EC may be arranged in a plurality of rows in the first direction Y. The number of device groups EC included in each row of device groups EC may be the same or different.

In some examples, as shown in FIGS. 8 to 11, the at least two device groups EC coupled to the driver circuit MIC are respectively located on two sides of the driver circuit MIC in the second direction X. There are two columns of device groups disposed between any two adjacent columns of driver circuits.

The driver circuits MIC and the device groups EC are arranged in the above arrangement manner. In this way, it is conducive to reducing a distance between each device group EC and a respective driver circuit MIC, thereby reducing the difficulty of wiring. Furthermore, it is conducive to improving the distribution uniformity of the driver circuits MIC and the device groups EC, thereby reducing the difficulty of wiring.

For example, in a same column of driver circuits and/or a same row of driver circuits, driver circuits MIC may be arranged at equal intervals.

For example, in a same column of device groups and/or a same row of device groups, device groups EC may be arranged at equal intervals.

Further, functional elements FE included in the device groups EC may be arranged in an array. For example, the functional elements FE may be arranged at equal intervals.

In this way, it is conducive to further improving the distribution uniformity of the driver circuits MIC and the device groups EC, and reducing the difficulty of debugging the array substrate 100, thereby further reducing the difficulty of wiring.

It will be noted that, in some examples, as shown in FIG. 13, the array substrate 100 may have a first region C1 and a second region C2. The driver circuit MIC shown in FIG. 12 may be located in the first region C1, for example. Driver circuits MIC located in the second region C2 are arranged in a row in the second direction X, for example.

For example, in a same column of driver circuits, driver circuits MIC located in the first region C1 may be, for example, arranged at equal intervals. In the same column of driver circuits, a distance between a driver circuit MIC located in the second region C2 and a driver circuit MIC adjacent thereto and located in the first region C1 is, for example, less than a distance between any two adjacent driver circuits MIC located in the first region C1.

Further, a relative position of a driver circuit MIC in the first region C1 with respect to a device group EC driven thereby may be different from a relative position of a driver circuit MIC in the second region C2 with respect to a device group EC driven thereby. Further, the array substrate 100 has a bonding region, and the bonding region is provided with circuit board bonding pads used for being respectively bonded to the external circuits (e.g., the circuit board, a flexible circuit board, and a chip on film) therein. The first region C1 may be located on a side of the second region C2 away from the bonding region.

For example, as shown in FIG. 13, the driver circuit MIC has two output pins OutP (e.g., Out1 and Out2) to drive two device groups EC, respectively. The array substrate 100 has a fan-out region and the bonding region, the fan-out region is provided with a fan-out line coupled to the circuit board bonding pad in the bonding region, and the fan-out line is further coupled to the driver circuit MIC and a driving line of the device group EC. The fan-out region may overlap with the second region C2, and in particular, with each device group EC in the second region C2. In the second region C2, a driver circuit MIC may be located on a side, away from the bonding region, of two device groups EC coupled thereto.

It will be understood that the array substrate 100 in the embodiments of the present disclosure is integrated with the driver circuit MIC for driving the device groups EC, which may simplify the external circuit for driving the array substrate 100 and simplify a control method thereof, thereby facilitating miniaturization of the external circuit. In particular, it is possible to reduce a volume of an integrated circuit in the external circuit, thereby reducing a cost of the integrated circuit. Furthermore, it is possible to reduce an area of the circuit board in the external circuit.

In some embodiments, as shown in FIGS. 8 to 11, the array substrate 100 further includes a plurality of signal lines L and a controller circuit 1 coupled to the plurality of signal lines L. The controller circuit 1 is configured to transmit signals to the plurality of signal lines, respectively.

In some examples, the types of the plurality of signal lines L vary. The controller circuit 1 is able to generate various types of signals and transmit each signal to a respective type of signal line L. For example, the controller circuit 1 may generate the clock signal, the data signal and the address signal, and provide them for the driver circuit MIC through the signal lines L, respectively.

In some examples, as shown in FIGS. 8 to 11, the plurality of signal lines L may include a plurality of clock signal lines CLKL extending in the first direction Y and arranged in the second direction X. A clock signal line CLKL may be coupled to clock pins CLKP of a column of driver circuits MIC.

For example, the number of clock signal lines CLKL may be equal to the number of columns in which the plurality of driver circuits MIC are arranged.

For example, the clock signal line CLKL may be disposed in a side, proximate to clock pins CLKP, of a respective column of driver circuits MIC. In this way, it is possible to reduce a distance between the clock signal line CLKL and the clock pins CLKP of the respective column of driver circuits MIC, thereby reducing the difficulty of wiring.

For example, the clock signal line CLKL may be disposed between the respective column of driver circuits MIC and device groups EC coupled to the respective column of driver circuits MIC. For another example, the clock signal line CLKL may be disposed in a side, away from the respective column of driver circuits MIC, of the device groups EC coupled to the respective column of driver circuits MIC.

For example, the controller circuit 1 may be coupled to the plurality of clock signal lines CLKL and provide clock signals CLK for the plurality of clock signal lines CLKL, respectively. Each clock signal line CLKL may transmit a clock signal CLK received thereby to clock pins CLKP of driver circuits MIC in a respective column.

It will be noted that the clock signals CLK provided by the controller circuit 1 are, for example, generated by a same crystal oscillator. The clock signals CLK provided by the controller circuit 1 for different clock signal lines CLKL may be, for example, the same. In this way, it is possible to enable the plurality of driver circuits MIC included in the array substrate 100 to receive a same clock signal CLK, so that a frequency of the clock signal CLK received by different driver circuits MIC is equal. As a result, it is conducive to improving the accuracy of receiving the data signal Data.

In some examples, as shown in FIGS. 8 to 11, the plurality of signal lines L may further include a plurality of data signal lines DataL each extending in the first direction Y. A data signal line DataL may be coupled to data pins DataP of a column of driver circuits MIC.

For example, the number of data signal lines DataL may be equal to the number of columns in which the plurality of driver circuits MIC are arranged.

For example, the data signal line DataL may be disposed in a side, proximate to data pins DataP, of a respective column of driver circuits MIC. In this way, it is possible to reduce a distance between the data signal line DataL and the data pins DataP in the respective column of driver circuits MIC, thereby reducing the difficulty of wiring.

For example, the data signal line DataL may be disposed between the respective column of driver circuits MIC and device groups EC coupled to the respective column of driver circuits MIC. For another example, the data signal line DataL may be disposed in a side, away from the respective column of driver circuits MIC, of the device groups EC coupled to the respective column of driver circuits MIC.

For example, the controller circuit 1 may be coupled to the plurality of data signal lines DataL and provide data signals Data for the plurality of data signal lines DataL, respectively. The data signals Data provided by the controller circuit 1 for different data signal lines DataL may be, for example, a same signal. In a case where the logic control component CTR in each driver circuit MIC receives the clock signal CLK and detects that the clock signal CLK is in the period of the active level, the logic control component CTR may control the data pin DataP thereof to receive the data signal Data of the data signal line DataL.

The data signal line DataL in the embodiments of the present disclosure transmits the data signal Data, which may avoid a problem that the number of pads and the number of lines are both too great caused by using a serial peripheral interface (SPI) to transmit the data signal Data, thereby simplifying the structures of the array substrate 100. As a result, the costs of the array substrate 100 are reduced.

For example, the controller circuit 1 may be provided with an encoder therein. The encoder may encode according to a 4b/5b encoding protocol, an 8b/10b encoding protocol or another encoding protocol to generate the data signal Data and transmit the data signal Data to the data signal line DataL. The decoder of the logic control component CTR may decode the data signal Data to acquire the address information and the luminance information in the data signal Data.

Here, as for the data signal Data provided by the controller circuit 1, reference may be made to the description in some of the above examples, and details will not be repeated here.

In some examples, as shown in FIGS. 8 to 11, the plurality of signal lines L may further include a plurality of device power supply signal lines VLEDL each extending in the first direction Y. Device groups EC coupled to a column of driver circuits MIC are further coupled to at least one device power supply signal line VLEDL.

For example, the device groups EC may be arranged in a column in the first direction Y. In this case, the device groups EC may be, for example, coupled to a device power supply signal line VLEDL.

For example, the device groups EC may be arranged in a plurality of columns in the first direction Y. In a case where the at least two device groups EC coupled to the driver circuit MIC are respectively located on the two sides of the driver circuit MIC, the number of device power supply signal lines VLEDL corresponding to a same column of driver circuits MIC may be two, and the two device power supply signal lines VLEDL are respectively located on two opposite sides of the same column of driver circuits MIC. In this case, one of the two device power supply signal lines VLEDL may be coupled to a device group EC located on one side of the driver circuit MIC, and the other of the two device power supply signal lines VLEDL may be coupled to another device group EC located on the other side of the driver circuit MIC.

For example, the device power supply signal line VLEDL may be disposed on a side, away from a respective driver circuit MIC, of the device group EC coupled thereto.

For example, the controller circuit 1 may be coupled to the plurality of device power supply signal lines VLEDL and provide device power supply voltage signals for the plurality of device power supply signal lines VLEDL, respectively. The device power supply voltage signals received by different device power supply signal lines VLEDL may be a same signal.

It will be understood that since each device power supply signal line VLEDL may be disposed on a side, away from a respective driver circuit MIC, of the device group EC coupled thereto, two device power supply signal lines VLEDL located between two adjacent columns of driver circuits MIC may be disposed adjacently, and there may be no other signal line L disposed between the two device power supply signal lines VLEDL. Since the device power supply voltage signals received by the different device power supply signal lines VLEDL may be the same signal, the two device power supply signal lines VLEDL may be combined into one device power supply signal line VLEDL.

In some examples, as shown in FIGS. 8 to 11, two columns of device groups EC located between any two adjacent columns of driver circuits MIC are coupled to a same device power supply signal line VLEDL, and the device power supply signal line VLEDL is the combined device power supply signal line VLEDL.

In this way, it is conducive to reducing the number of device power supply signal lines VLEDL, thereby reducing the number of signal lines L. As a result, it is conducive to simplifying the structure of the array substrate 100 and reducing the cost and the difficulty of manufacturing the array substrate 100.

For example, a dimension of the combined device power supply signal line VLEDL in the second direction X may be greater than or equal to a dimension of the device power supply signal line VLEDL before the combining in the second direction X. Optionally, the combined device power supply signal line VLEDL may include a hollow portion.

In some examples, as shown in FIGS. 8 to 11, the plurality of signal lines L may further include a plurality of chip power supply signal lines VCCL each extending in the first direction Y. A chip power supply signal line VCCL may be coupled to chip power supply pins VCCP of a column of driver circuits MIC.

For example, the number of chip power supply signal lines VCCL may be equal to the number of columns in which the plurality of driver circuits MIC are arranged.

For example, the chip power supply signal line VCCL may be disposed on a side, proximate to chip power supply pins VCCP, of a respective column of driver circuits MIC. In this way, it is possible to reduce a distance between the chip power supply signal line VCCL and the chip power supply pins VCCP in the respective column of driver circuits MIC, thereby reducing the difficulty of wiring.

For example, the chip power supply signal line VCCL may be disposed between the respective column of driver circuits MIC, and device groups EC coupled to the respective column of driver circuits MIC. For another example, the chip power supply signal line VCCL may be disposed on a side, away from the respective column of driver circuits MIC, of the device groups EC coupled to the respective column of driver circuits MIC.

For example, the controller circuit 1 may be coupled to the plurality of chip power supply signal lines VCCL and provide power supply voltage signals for the plurality of chip power supply signal lines VCCL, respectively. Each chip power supply signal line VCCL may transmit a power supply voltage signal received thereby to chip power supply pins VCCP of driver circuits MIC in a respective column.

In some examples, as shown in FIGS. 8 to 11, the plurality of signal lines L may further include a plurality of grounding signal lines GNDL each extending in the first direction Y. A grounding signal line GNDL may be coupled to grounding pins GNDP of a column of driver circuits MIC.

For example, the number of grounding signal lines GNDL may be equal to the number of columns in which the plurality of driver circuits MIC are arranged.

For example, the grounding signal line GNDL may be disposed on a side, proximate to grounding pins GNDP, of a respective column of driver circuits MIC. In this way, it is possible to reduce a distance between the grounding signal line GNDL and the grounding pins GNDP in the respective column of driver circuits MIC, thereby reducing the difficulty of wiring.

For example, the grounding signal line GNDL may be disposed between the respective column of driver circuits MIC and device groups EC coupled to the respective column of driver circuits MIC. For another example, the grounding signal line GNDL may be disposed on a side, away from the respective column of driver circuits MIC, of the device groups EC coupled to the respective column of driver circuits MIC.

For example, the controller circuit 1 may be coupled to the plurality of grounding signal lines GNDL and provide grounding signals for the plurality of grounding signal lines GNDL, respectively. Each grounding signal line GNDL may transmit a grounding signal received thereby to grounding pins GNDP of driver circuits MIC of a respective column.

For example, as shown in FIGS. 12 and 13, a dimension of the grounding signal line GNDL in the second direction X is relatively great. The driver circuit MIC may overlap with the grounding signal line GNDL. In this way, it is convenient for providing electromagnetic shielding for the driver circuit MIC by using the grounding signal loaded on the grounding signal line GNDL.

In some examples, as shown in FIGS. 8 to 11, the plurality of signal lines L may further include a plurality of address signal lines ADDRL. A relay pin Di_out of a driver circuit MIC may be coupled to one end of an address signal line ADDRL, and an address pin Di_in of another driver circuit MIC may be coupled to the other end of the address signal line ADDRL.

An arrangement manner of the plurality of address signal lines ADDRL is related to the arrangement manner of the plurality of driver circuits MIC. For example, as shown in FIGS. 8 to 11, the plurality of driver circuits MIC in the array substrate 100 are cascaded. The cascading manner of the plurality of driver circuits MIC varies, which may be set according to actual needs and is not limited in the embodiments of the present disclosure.

Figure 9:
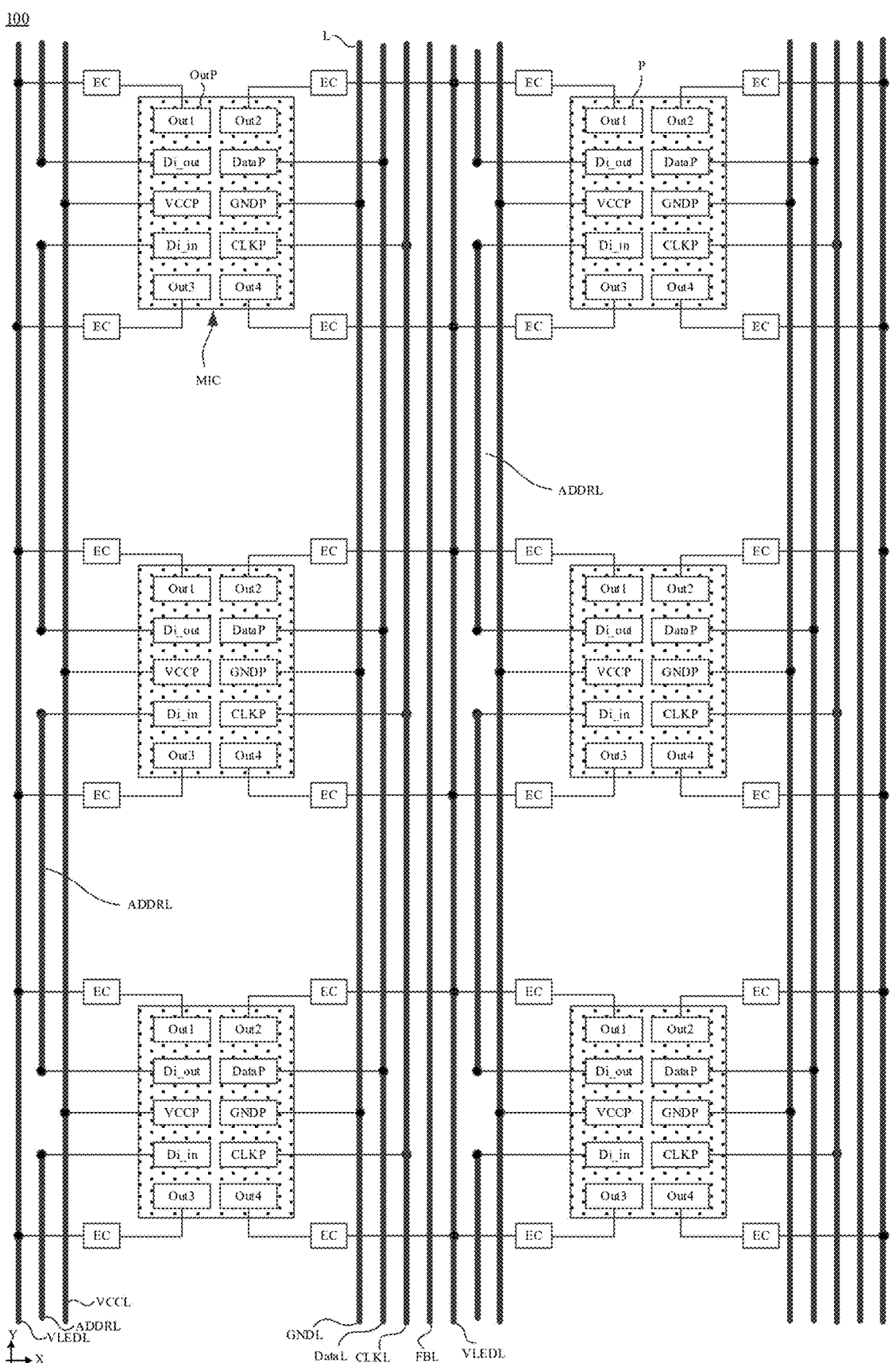
FIG. 9 is a structural diagram of another array substrate, in accordance with some embodiments of the present disclosure.
Figure 10:
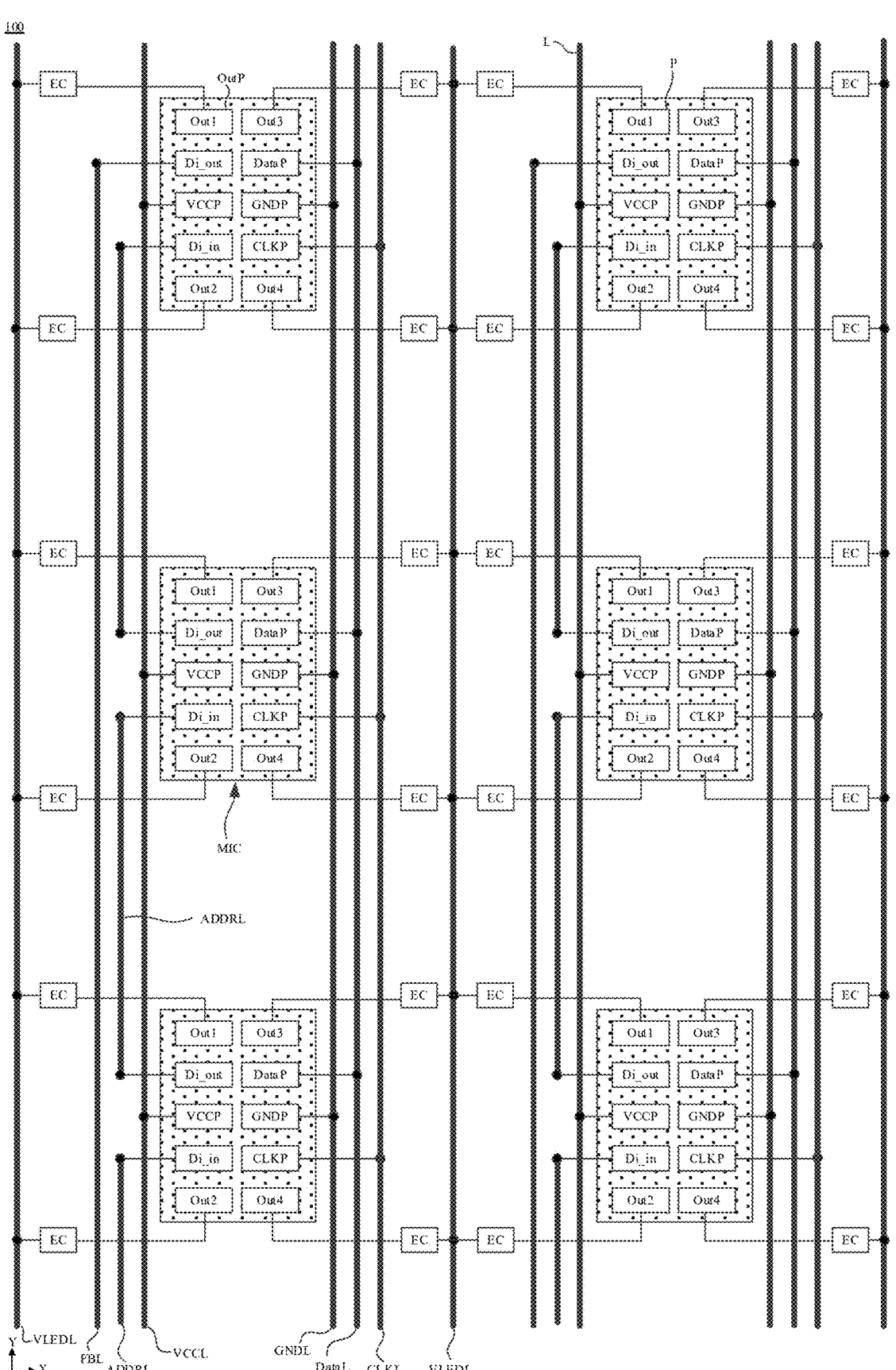
FIG. 10 is a structural diagram of yet another array substrate, in accordance with some embodiments of the present disclosure.

In a possible example, as shown in FIGS. 8 to 10, the driver circuit MIC includes the address pin Di_in and the relay pin Di_out. In a same column of driver circuits MIC, a relay pin Di_out of an N-th driver circuit MIC is coupled to an address pin Di_in of a (N+1)-th driver circuit MIC;

where N is a positive integer. That is, in the plurality of driver circuits MIC included in the array substrate 100, driver circuits MIC in a same column are cascaded with one another, and driver circuits in different columns are not cascaded with one another.

In this case, in the same column of driver circuits MIC, the relay pin Di_out of the N-th driver circuit MIC may be coupled to one end of an address signal line ADDRL, and the address pin Di_in of the (N+1)-th driver circuit MIC may be coupled to the other end of the address signal line ADDRL. Moreover, different columns of driver circuits MIC are not coupled through the address signal line ADDRL.

It will be noted that, in each column of driver circuits, an address pin Di_in of a first driver circuit MIC may be coupled to one end of an address signal line ADDRL, and the other end of the address signal line ADDRL may be coupled to the controller circuit 1 to receive an address signal.

It will be understood that, in the same column of driver circuits MIC, the (N+1)-th driver circuit MIC may serve as a subsequent driver circuit of the N-th driver circuit MIC. After the N-th driver circuit MIC acquires and stores address information thereof, the N-th driver circuit MIC may configure address information for the (N+1)-th driver circuit MIC according to the address information thereof, so as to achieve configurations of dynamic addresses for the driver circuits MIC that are cascaded. That is, a relay signal output by the relay pin Di_out of the N-th driver circuit MIC may serve as an address signal of the (N+1)-th driver circuit MIC and may be received by the address pin Di_in of the (N+1)-th driver circuit MIC.

In these examples, as shown in FIGS. 8 to 10, the address pin Di_in and the relay pin Di_out included in the driver circuit MIC may be, for example, located on a same side. Correspondingly, each address signal line ADDRL may extend in the first direction Y.

Further, in a same column of driver circuits MIC, address pins Di_in and relay pins Di_out of different driver circuits MIC may be, for example, located on a same side, respectively. Thus, address signal lines ADDRL corresponding to the same column of driver circuits may be located on the same side of this column of driver circuits MIC, and extending lines of the address signal lines ADDRL corresponding to the same column of driver circuits may coincide. In this way, it is conducive to reducing a wiring space of the address signal lines ADDRL in the second direction X, and increasing a wiring space of other signal lines L, and in turn, it is conducive to increasing widths of lines such as the device power supply signal line VLEDL and the grounding signal line GNDL, so as to reduce resistances of these signal lines L.

For example, the address signal line ADDRL may be disposed between a respective column of driver circuits MIC and device groups EC coupled to the respective column of driver circuits MIC. For another example, the address signal line ADDRL may be disposed on a side, away from the respective column of driver circuits MIC, of the device groups EC coupled to the respective column of driver circuits MIC.

Figure 11:
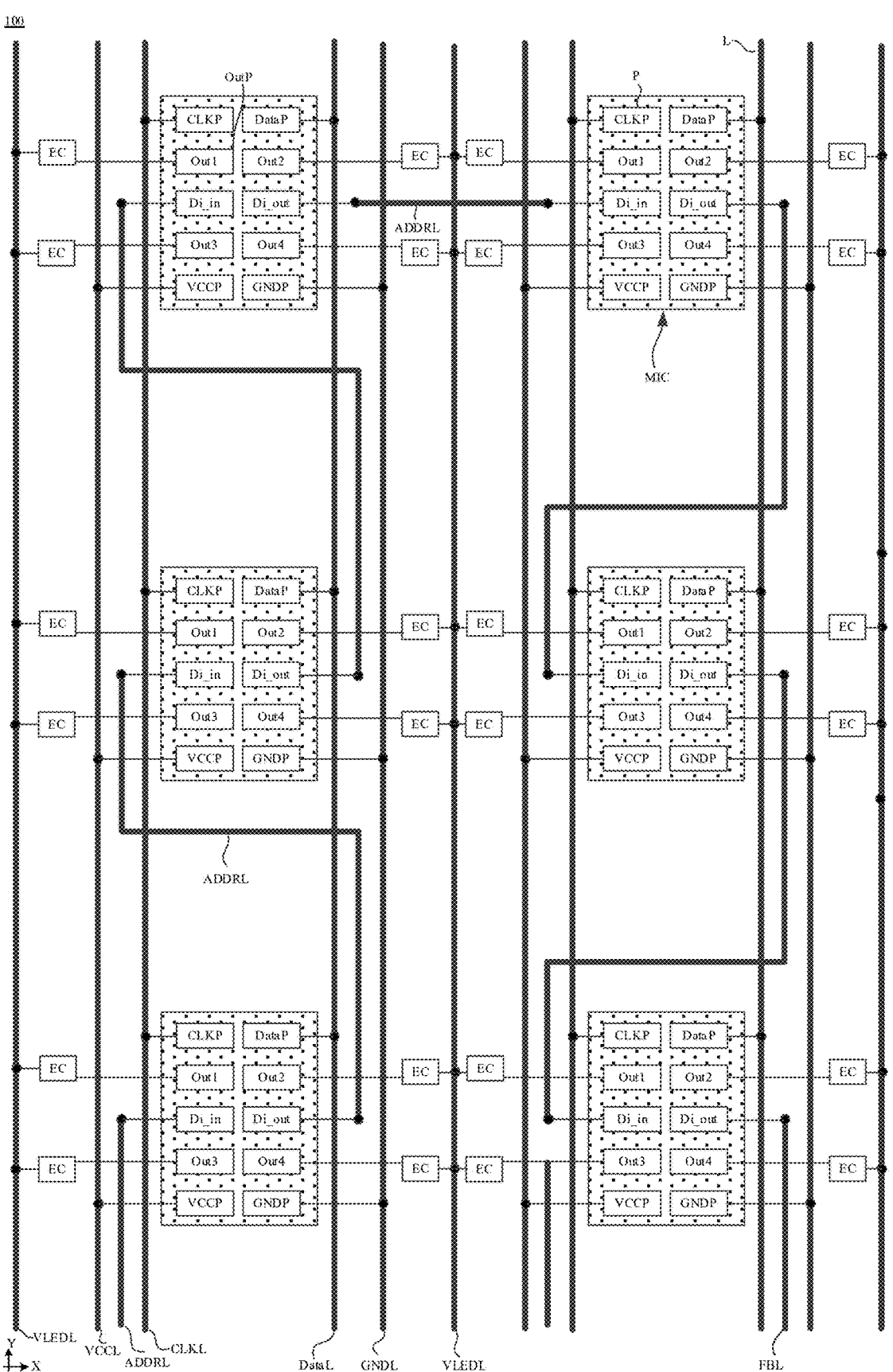
FIG. 11 is a structural diagram of yet another array substrate, in accordance with some embodiments of the present disclosure.

In another possible example, as shown in FIG. 11, the driver circuit MIC includes the address pin Di_in and the relay pin Di_out. In the plurality of driver circuits MIC included in the array substrate 100, a relay pin Di_out of an M-th driver circuit MIC is coupled to an address pin Di_in of a (M+1)-th driver circuit MIC; where M is a positive integer. That is, the plurality of driver circuits MIC included in the array substrate 100 are cascaded in sequence. The plurality of driver circuits MIC may be, for example, cascaded in a shape of "S".

In this case, in the plurality of driver circuits MIC included in the array substrate 100, the relay pin Di_out of the M-th driver circuit MIC may be coupled to one end of an address signal line ADDRL, and the address pin Di_in of the (M+1)-th driver circuit MIC may be coupled to the other end of the address signal line ADDRL.

It will be noted that, in the plurality of driver circuits MIC, an address pin Di_in of a first driver circuit MIC may be coupled to one end of an address signal line ADDRL, and the other end of the address signal line ADDRL may be coupled to the controller circuit 1 to receive an address signal.

It will be understood that, in the plurality of driver circuits MIC, the (M+1)-th driver circuit MIC may serve as a subsequent driver circuit of the M-th driver circuit MIC. After the M-th driver circuit MIC acquires and stores address information thereof, the M-th driver circuit MIC may configure address information for the (M+1)-th driver circuit MIC according to the address information thereof, so as to achieve the configurations of the dynamic addresses for the driver circuits MIC that are cascaded. That is, a relay signal output by the relay pin Di_out of the M-th driver circuit MIC may serve as an address signal of the (M+1)-th driver circuit MIC and may be received by the address pin Di_in of the (M+1)-th driver circuit MIC.

In this example, as shown in FIG. 11, the address pin Di_in and the relay pin Di_out included in the driver circuit MIC may be, for example, located on different sides, respectively. Correspondingly, each address signal line ADDRL coupled to different driver circuits MIC in a same column of driver circuits MIC may be in a shape of a broken line, which may be, for example, in a shape of "S" or "Z". One end of the address signal line ADDRL may be located on a side of the same column of driver circuits MIC and coupled to an address pin Di_in of a driver circuit MIC of the same column of driver circuits MIC, and the other end of the address signal line ADDRL may be located on another side of the same column of driver circuits MIC and coupled to a relay pin Di_out of another driver circuit MIC of the same column of driver circuits MIC. Each address signal line ADDRL coupled to different driver circuits MIC that are respectively in different columns may be in a shape of a straight line and extend in the second direction X. One end of the address signal line ADDRL may be coupled to an address pin Di_in of a driver circuit MIC of a column of driver circuits MIC, and the other end of the address signal line ADDRL may be coupled to a relay pin Di_out of a driver circuit MIC of another column of driver circuits MIC.

In some examples, as shown in FIGS. 8 to 11, the plurality of signal lines L may further include at least one feedback signal line FBL. The at least one feedback signal line FBL may extend, for example, in the first direction Y.

In a possible example, as shown in FIGS. 8 to 10, in a case where in the same column of driver circuits MIC, the relay pin Di_out of the N-th driver circuit MIC is coupled to the address pin Di_in of the (N+1)-th driver circuit MIC, the plurality of signal lines L may include a plurality of feedback signal lines FBL. A relay pin Di_out of a last driver circuit MIC in any column of driver circuits MIC is coupled to a feedback signal line FBL.

For example, in the plurality of driver circuits included in the array substrate 100 with the above cascading relationship, each column of driver circuits has a last driver circuit MIC, and a relay pin Di_out of the last driver circuit MIC is coupled to a feedback signal line FBL. That is, the number of feedback signal lines FBL may be equal to the number of columns in which the plurality of driver circuits MIC are arranged.

For example, as shown in FIGS. 8 to 10, the feedback signal line FBL may be disposed on a side, proximate to a relay pin Di_out, of a respective column of driver circuits MIC. In this way, it is possible to reduce a distance between the feedback signal line FBL and the relay pins Di_out of the respective column of driver circuits MIC, thereby reducing the difficulty of wiring.

For example, the feedback signal line FBL may be disposed between the respective column of driver circuits MIC and device groups EC coupled to the respective column of driver circuits MIC. For another example, the feedback signal line FBL may be disposed on a side, away from the respective column of driver circuits MIC, of the device groups EC coupled to the respective column of driver circuits MIC.

In another possible example, as shown in FIG. 11, in a case where in the plurality of driver circuits MIC included in the array substrate 100, the relay pin Di_out of the M-th driver circuit MIC is coupled to the address pin Di_in of the (M+1)-th driver circuit MIC, the plurality of signal lines L may include one feedback signal line FBL. A relay pin Di_out of a last driver circuit MIC is coupled to the feedback signal line FBL.

For example, as shown in FIG. 11, the feedback signal line FBL may be disposed on a side, proximate to the relay pin Di_out, of the last driver circuit MIC. In this way, it is possible to reduce a distance between the feedback signal line FBL and the relay pin Di_out in the last driver circuit MIC, thereby reducing the difficulty of wiring.

It will be understood that, one end of each feedback signal line FBL is coupled to the relay pin Di_out of the driver circuit MIC, and the other end thereof is coupled to the controller circuit 1. After a configuration of an address of the last driver circuit MIC of each column of driver circuits is completed, or after a configuration of an address of the last driver circuit MIC of the plurality of driver circuits MIC is completed, a signal may be fed back to the controller circuit 1 through the feedback signal line FBL to indicate that the configurations of the addresses are complete.

In addition, in some of the above examples, in a case where the driver circuit MIC includes the short circuit detector and the open circuit detector, information such as the short circuit and/or the open circuit occurring between each device group EC and the driver circuit MIC may also be fed back to the controller circuit 1 through the feedback signal line FBL.

It will be understood that FIGS. 8 to 11 are merely used for illustrating a coupling relationship among the driver circuits MIC, the device groups EC and the signal lines L. In FIGS. 8 to 11, in order to show electrical connection relationships more clearly, sizes of the driver circuits MIC, the device groups EC and the signal lines L are not drawn to scale, and relative positional relationships among the driver circuits MIC, the device groups EC and the signal lines L are not shown according to actual positions.

Figure 14:
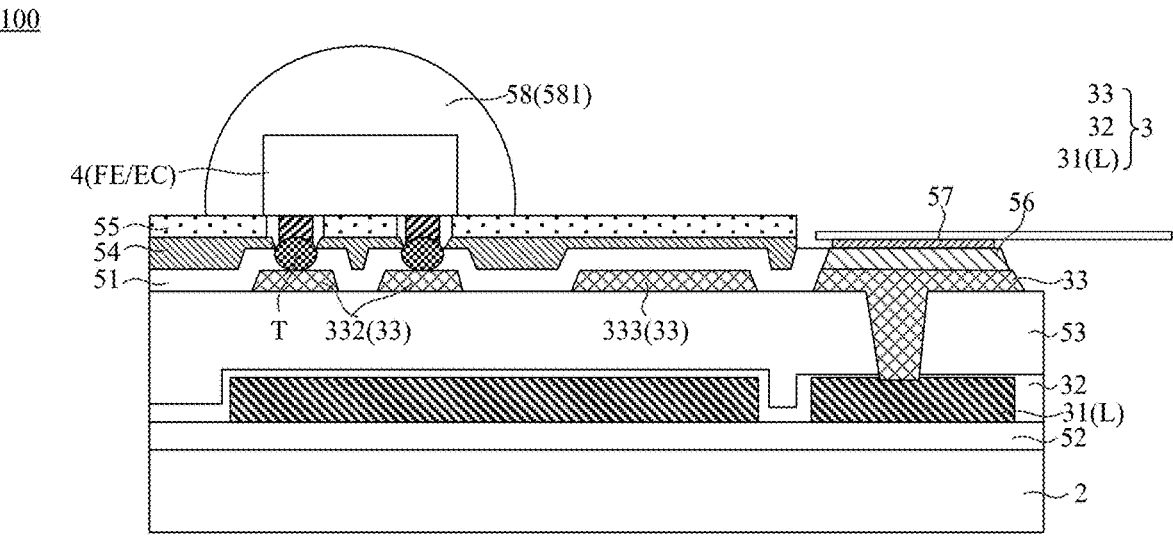
FIG. 14 is a structural diagram of film layers of an array substrate, in accordance with some embodiments of the present disclosure.

In some embodiments, from a perspective of film layer structures, as shown in FIG. 14, the array substrate 100 further includes a substrate 2, a driving circuit layer 3 and a device layer 4 that are disposed on a side of the substrate 2.

In some examples, the substrate 2 may be a substrate formed of an inorganic material, a substrate formed of an organic material, or a composite substrate formed by laminating an organic material and an inorganic material.

For example, a material of the substrate 2 may be a glass material such as soda-lime glass, quartz glass or sapphire glass, or may be a metal material such as stainless steel, aluminum or nickel.

For example, the material of the substrate 2 may be polymethyl methacrylate (PMMA), polyvinyl alcohol (PVA), polyvinyl phenol (PVP), polyether sulfone (PES), polyimide, polyamide, polyacetal, poly carbonate (PC), polyethylene terephthalate (PET), polyethylene naphthalate (PEN) or a combination thereof.

In some examples, as shown in FIG. 14, the plurality of driver circuits and the plurality of device groups EC included in the array substrate 100 may be located in the device layer 4.

In some examples, as shown in FIG. 14, the driving circuit layer 3 includes a driving line layer 31, an insulating layer 32 and a wiring layer 33 that are stacked in sequence.

For example, as shown in FIG. 14, the plurality of signal lines L included in the array substrate 100 may be located in the driving line layer 31. That is, the driving line layer 31 may include the data signal lines DataL used for loading the data signals, the clock signal lines CLKL used for loading the clock signals, the device power supply signal lines VLEDL used for loading the device power supply voltage signals, etc.

For example, as shown in FIG. 14, the wiring layer 33 may include a plurality of chip pads (that are not shown in the figure), a plurality of device pads 332 and a plurality of connection lines 333. The plurality of driver circuits MIC may be bonded to the plurality of chip pads, and the functional elements FE of the plurality of device groups EC may be bonded to the plurality of device pads 332. Of course, the wiring layer 33 may further include, for example, a controller pad used for being bonded to the controller circuit 1.

In the embodiments of the present disclosure, chip pads bonded to pins P of a same driver circuit MIC may constitute a chip pad group. The driving circuit layer 3 in the array substrate 100 may include a plurality of chip pad groups, and the plurality of chip pad groups are bonded to the plurality of driver circuits MIC in a one-to-one correspondence.

For example, in the embodiments of the present disclosure, the driver circuit MIC may include the clock pin CLKP, the at least two output pins OutP, the address pin Di_in, the relay pin Di_out, the chip power supply pin VCCP, the data pin DataP and the grounding pin GNDP. Correspondingly, the chip pad group may include a clock pad used for being bonded to the clock pin CLKP, output pads used for being respectively bonded to the at least two output pins OutP, an address pad used for being bonded to the address pin Di_in, a relay pad used for being bonded to the relay pin Di_out, a chip power supply pad used for being bonded to the chip power supply pin VCCP, a data pad used for being bonded to the data pin DataP and a grounding pad used for being bonded to the grounding pin GNDP.

In the array substrate 100, an arrangement manner of the chip pads in the chip pad group may be set according to an arrangement manner of the pins P of the driver circuit MIC, which is not limited in the embodiments of the present disclosure as long as bonding between the driver circuit MIC and the chip pad group can be satisfied.

For example, as shown in FIG. 14, a connection line 333 may be coupled to a chip pad and the driving line layer 31. Alternatively, the connection line 333 may be coupled to a device pad 332 and the driving line layer 31. That is, the chip pad may be coupled to a respective signal line L in the driving line layer 31 through a connection line 333, and the device pad 332 may be coupled to a respective signal line L in the driving line layer 31 through another connection line 333. Of course, the driver circuit MIC may be coupled to the device group EC through connection lines 333.

Optionally, the output pin OutP may be coupled to the device pad bonded to the device group EC through a connection line 333; the address pad may be coupled to the address signal line ADDRL through a connection line 333; the chip power supply pad may be coupled to the chip power supply signal line VCCL through a connection line 333; the data pad may be coupled to the data signal line DataL through a connection line 333; the device pad bonded to the device group EC may be coupled to the device power supply signal line VLEDL through a connection line 333; and the grounding pad may be coupled to the grounding signal line GNDL through a connection line 333. Of course, in the embodiments of the present disclosure, the grounding pad may be directly coupled to the grounding signal line GNDL through a via hole.

Optionally, the connection line 333 may be coupled to the signal line L in the driving line layer 31 through a via hole in the insulating layer 32.

In an example of the present disclosure, a thickness of the driving line layer 31 may be greater than a thickness of the wiring layer 33. In this way, it is conducive to reducing a resistance of the driving line layer 31, so as to reduce a voltage drop of a signal on each signal line L.

Optionally, the thickness of the driving line layer 31 may be in a range from 1.5 μm to 7 μm. A material of the driving line layer 31 may include copper. For example, the driving line layer 31 may be formed by means of sputtering. The driving line layer 31 may be constituted by multiple stacked film layers such as a molybdenum-niobium film, a copper film and another molybdenum-niobium film (MoNb/Cu/MoNb). A thickness of the MoNb film, proximate to the substrate 2, in the multiple film layers is approximately 300 Å, and the MoNb thin film is mainly used for improving adhesion between the driving line layer 31 and the substrate 2; the Cu film in the multiple film layers may provide a relatively good transmission channel for electrical signals; and a thickness of the another MoNb film, away from the substrate 2, in the multiple film layers is approximately 200 Å, and the another MoNb film may be used for protecting the Cu film and prevent a surface of the Cu film with a low resistivity from being exposed and oxidized. Since a thickness obtained by sputtering once is generally not greater than 1 μm, the driving line layer 31 whose thickness is greater than 1 μm need to be manufactured by sputtering more than once. In addition, the driving line layer 31 may be formed by means of electroplating. Specifically, a seed layer may be formed of molybdenum-nickel-titanium alloy (MoNiTi), so as to increase a nucleation density of metal grains in a subsequent electroplating process; after that, copper with a low resistivity is manufactured by electroplating; and then, an anti-oxidation layer is manufactured, and a material of the anti-oxidation layer may be MoNiTi. Optionally, a surface, away from the substrate 2, of the driving line layer 31 may be covered by the insulating layer 32, so as to ensure reliability and a stability of an electrical path.

Optionally, a thickness of the wiring layer 33 is approximately 6000 Å. From a process of manufacturing the array substrate to a process of bonding the electronic elements, a problem of oxidation may occur when each pad is exposed to air. In this case, an anti-oxidation material layer may be provided only in a region where an exposed surface of each pad is located. That is, the region where the exposed surface of each pad is located has one more layer of structure than a region where the lines are located. Alternatively, the wiring layer 33 is integrally set to be of a laminated structure of at least two layers, a material of a film layer, away from the substrate 2, of the laminated structure of at least two layers is an anti-oxidation metal or alloy material, and the laminated structure of at least two layers may specifically include a laminated structure of a molybdenum-niobium layer, a copper layer and a copper-nickel layer (MoNb/Cu/CuNi); the MoNb layer at the bottom of the laminated structure is mainly used for improving adhesion, the Cu layer at the middle of the laminated structure is mainly used for transmitting the electrical signals due to the low resistivity, and the CuNi layer at the top of the laminated structure may not only prevent the middle layer from being oxidized but also ensure a fastness of a connection to the electronic element. A surface, away from the substrate 2, of the lines may be covered by another insulating layer 51, so as to ensure the reliability and the stability of the electrical path.

Optionally, as shown in FIG. 14, the array substrate 100 may further include: a buffer layer 52 disposed between the substrate 2 and the driving line layer 31; a first planarization layer 53 disposed between the insulating layer 32 and the wiring layer 33; a second planarization layer 54 and a reflective layer 55 both disposed on a side of the another insulating layer 51 away from the wiring layer 33; a transparent electrode 56 disposed on a bonding pad in the bonding region; and an anisotropic conductive adhesive 57 disposed between the transparent electrode 56 and the external circuit (e.g., the flexible circuit board). The buffer layer 52 may prevent impurities in the substrate 2 from adversely affecting a conductivity of the driving line layer 31. The first planarization layer 53 may provide a planar surface for manufacturing the wiring layer 33. The second planarization layer 54 may provide a planar surface for subsequently bonding the functional elements FE and the driver circuits MIC. A material of the reflective layer 55 may be a white ink for improving a reflectivity of the array substrate 100, so as to reduce light losses. The transparent electrode 56 and the anisotropic conductive adhesive 57 are used for achieving an electrical connection between the bonding pad (e.g., the circuit board bonding pad) in the bonding region and the external circuit (e.g., the flexible circuit board).

Optionally, as shown in FIG. 14, the array substrate 100 may further include an encapsulation layer 58 disposed on a side of the device layer 4 away from the substrate 2. The encapsulation layer 58 includes a layer structure used for encapsulating the functional element FE on the substrate 2. For example, surfaces of the functional elements FE in the array substrate 100 may be coated with an encapsulation adhesive and after performing a drying process to form the encapsulation layer 58. A material of the encapsulation adhesive may include a UV curable resin or a thermosetting resin that is transparent. That is, a material of the encapsulation layer 58 may be a transparent protective adhesive. In some embodiments, the encapsulation layer 58 may include a plurality of transparent protective structures 581.

Optionally, as shown in FIG. 14, pins of the functional element FE are coupled to device pads 332 through solder pastes T, respectively; and the device pads 332 are coupled according to a position of each functional element FE in an electrical circuit.

Figure 15:
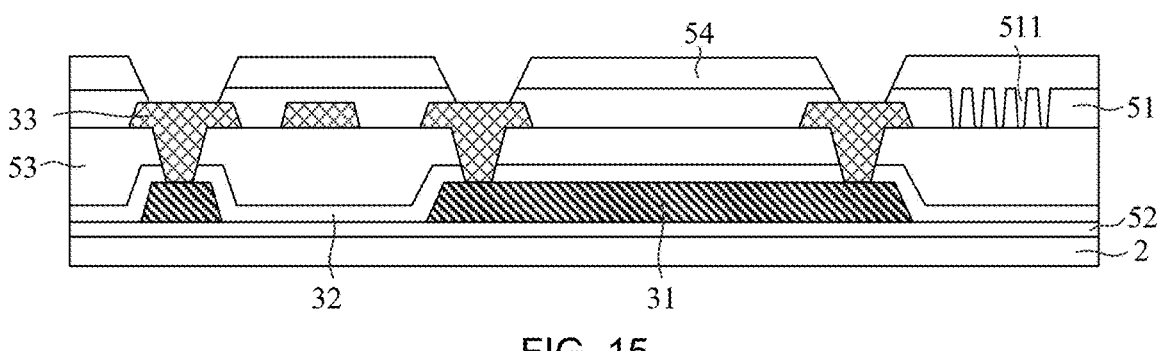
FIG. 15 is a structural diagram of film layers of another array substrate, in accordance with some embodiments of the present disclosure.

FIG. 15 is another structural diagram of the array substrate 100 in the embodiments of the present disclosure. All the functional elements FE and all the driver circuits MIC are not shown in FIG. 15. In a case where a material of the second planarization layer 54 is an organic insulating material, a plurality of vent holes 511 may be provided in the another insulating layer 51. The plurality of vent holes 511 each expose a portion of the first planarization layer 53 located below. In the process of manufacturing the array substrate 100, gas accumulated in the first planarization layer 53 may be released through the plurality of vent holes 511, so that problems (e.g., warpage and peeling) of film layers of the array substrate 100 may be avoided. As a result, it is possible to improve a product yield.

For example, the plurality of vent holes 511 are provided in the structure shown in FIG. 15, which is merely an example and is not a limitation of the embodiments of the present disclosure. In other embodiments, a greater or lesser number of vent holes 511 may be provided.

Figure 17:
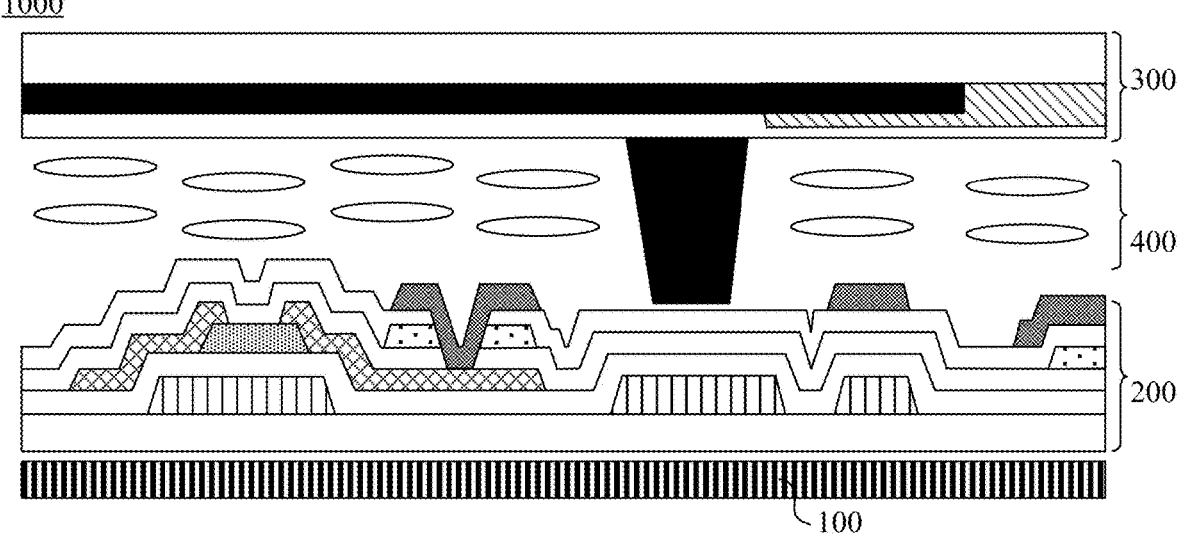
FIG. 17 is a structural diagram of a display apparatus, in accordance with some embodiments of the present disclosure.

Some embodiments of the present disclosure provide a display apparatus 1000, as shown in FIG. 17, the display apparatus 1000 includes the array substrate 100 as described in any one of the above embodiments.

Based on this, in the device groups EC included in the array substrate 100, each functional element FE may be a light-emitting element.

In some examples, the display apparatus 1000 may be an LED display apparatus or a liquid crystal display apparatus.

For example, in a case where the display apparatus 1000 is the LED display apparatus, the functional element FE (e.g., the Micro LED, the Mini LED, the LED) may emit light to display images directly.

Optionally, each functional element FE may emit light of a same color, e.g., light of a blue color, light of a red color, light of a green color or light of a yellow color. In this way, the display apparatus 1000 may be a monochrome display apparatus, which may be a display apparatus such as an instrument dial, a signal indicating screen. Optionally, the functional elements FE may emit light of different colors, which may include, for example, at least two of the light of the red color, the light of the green color, the light of the blue color and the light of the yellow color. The functional elements FE emitting the light of the different colors may be each controlled independently. In this way, the display apparatus 1000 may perform color display by mixing light.

For example, in a case where the display apparatus 1000 is the liquid crystal display apparatus, the array substrate 100 may serve as a backlight source. In this case, the display apparatus 1000 further includes a driving substrate 200 disposed on a side of the array substrate 100, a color filter substrate 300 disposed on a side of the driving substrate 200 away from the array substrate 100, and a liquid crystal layer 400 disposed between the driving substrate 200 and the color filter substrate 300.

Optionally, each functional element FE may emit light of a same color, e.g., light of a white color or light of a blue color. Each device group EC may work independently under driving of the driver circuit MIC, so that each device group EC may emit light independently. In this way, the display apparatus 1000 may achieve local dimming to achieve an effect of high-dynamic range (HDR), thereby improving a display quality of the display apparatus 1000. In any device group EC, the number of functional elements FE is equal, and a coupling manner of the functional elements FE is the same. In this way, the distribution uniformity of the functional elements FE in the array substrate 100 may be ensured, which is conducive to improving the uniformity of light emitting of the array substrate 100 and reducing the difficulty of debugging the backlight source (i.e., the array substrate 100).

In some examples, the controller circuit 1 in the array substrate 100 may include a field programmable gate array (FPGA) and/or a physical (PHY) chip. For example, the controller circuit 1 is powered by an input voltage (VP) and is grounded (GND). The controller circuit 1 may use an active matrix driving method or a passive matrix driving method to control the array substrate 100, which is conducive to reducing the power consumption and avoiding flickering and other adverse phenomena.

Figure 16:
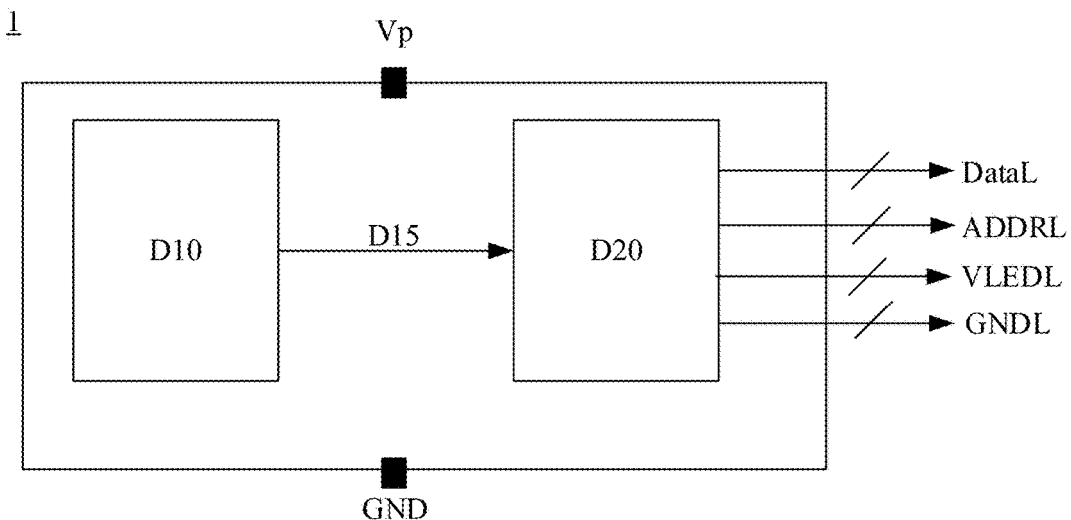
FIG. 16 is a structural diagram of a controller circuit, in accordance with some embodiments of the present disclosure.

For example, as shown in FIG. 16, the controller circuit 1 includes a timing controller D10 and a bridge D20. The timing controller D10 may generate an image control signal D15 for indicating values for driving pixels of the array substrate 100 and timings for driving the pixels. For example, the timing controller D10 controls timings of image frames or video frames, and controls timings for driving all of device groups EC (which may be, for example, LEDs located in LED light regions) in the image frames or the video frames. In addition, the timing controller D10 controls luminance used for driving each of the LED light regions during given image frames or video frames. The timing controller D10 provides the image control signal D15 for the bridge D20.

The bridge D20 converts the image control signal D15 into the address signal and the data signal. For example, the bridge D220 may generate, according to the above control scheme, an address signal for driving a first driver circuit MIC in cascaded driver circuits MIC during an addressing mode.

Beneficial effects that may be achieved by the display apparatus 1000 provided in some embodiments of the present disclosure are the same as beneficial effects that may be achieved by the driver circuit MIC and the array substrate 100 that are provided in some of the above embodiments, and details will not be repeated here.

In some examples, the display apparatus 1000 may be any apparatus that displays text or images whether in motion (e.g., a video) or stationary (e.g., a still image). More specifically, it is anticipated that the embodiments may be implemented in a variety of electronic apparatuses or associated with a variety of electronic apparatuses. The variety of electronic apparatuses include (but are not limited to): mobile phones, wireless apparatuses, personal digital assistants (PDAs), hand-held or portable computers, global positioning system (GPS) receivers/navigators, cameras, moving picture experts group 4 (MP4) video players, video cameras, game consoles, watches, clocks, calculators, television monitors, flat-panel displays, computer monitors, automobile displays (e.g., odometer displays), navigators, cockpit controllers and/or displays, camera view displays (e.g., displays of rear-view cameras in vehicles), electronic photos, electronic billboards or signs, projectors, building structures, packaging and aesthetic structures (e.g., displays for displaying an image of a piece of jewelry), etc.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. An array substrate, comprising:
a plurality of driver circuits, a driver circuit including a logic control component and a plurality of pins coupled to the logic control component, wherein the plurality of pins include: a clock pin, a data pin, and at least two output pins;
a plurality of device groups respectively coupled to output pins of the plurality of driver circuits, a device group including at least one functional element; and
a plurality of signal lines; wherein
the plurality of driver circuits are arranged in a plurality of columns in a second direction, and the plurality of signal lines include:
a plurality of clock signal lines each extending in a first direction, a clock signal line being coupled to clock pins of at least one column of driver circuits;
a plurality of data signal lines each extending in the first direction, a data signal line being coupled to data pins of the at least one column of driver circuits; and
a plurality of device power supply signal lines each extending in the first direction, a device power supply signal line being coupled to device groups coupled to at least part of driver circuits in each column of the at least one column of driver circuits; wherein the first direction intersects with the second direction;
the device group includes at least two functional elements, and the at least two functional elements are connected in series.

2. The array substrate according to claim 1, wherein the plurality of pins further includes an address pin and a relay pin;
the plurality of driver circuits are cascaded in sequence; in the plurality of driver circuits, a relay pin of an M-th driver circuit is coupled to an address pin of an (M+1)-th driver circuit, M is a positive integer.

3. The array substrate according to claim 2, wherein the plurality of signal lines further include a feedback signal line; wherein
in the plurality of driver circuits, a relay pin of a last driver circuit is coupled to the feedback signal line.

4. The array substrate according to claim 2, wherein the plurality of signal lines further include a plurality of address signal lines, wherein
the relay pin of the M-th driver circuit is coupled to an end of an address signal line, and the address pin of the (M+1)-th driver circuit is coupled to another end of the address signal line.

5. The array substrate according to claim 2, wherein the address pin and the relay pin included in the driver circuit are located on different side of the driver circuit.

6. The array substrate according to claim 1, wherein the plurality of device groups are arranged in a plurality of columns in the second direction; at least two device groups coupled to the driver circuit are respectively located on two sides of the driver circuit; wherein
device groups coupled to a same column of driver circuits are coupled to two device power supply signal lines, and the two device power supply signal lines are respectively located on two opposite sides of the same column of driver circuits.

7. The array substrate according to claim 6, wherein two columns of device groups located between any two adjacent columns of driver circuits are coupled to a same device power supply signal line.

8. The array substrate according to claim 6, wherein functional elements included in a same column of device groups are arranged in an array.

9. The array substrate according to claim 1, wherein the plurality of pins further includes an address pin and a relay pin;

wherein in a same column of driver circuits, a relay pin of an N-th driver circuit is coupled to an address pin of an (N+1)-th driver circuit, N is a positive integer.

10. The array substrate according to claim 9, wherein the plurality of signal lines further include at least one feedback signal line, wherein a relay pin of a last driver circuit in any column of driver circuits is coupled to a feedback signal line.

11. The array substrate according to claim 9, wherein the plurality of signal lines further include a plurality of address signal lines, wherein the relay pin of the N-th driver circuit is coupled to an end of an address signal line, and the address pin of the (N+1)-th driver circuit is coupled to another end of the address signal line.

12. The array substrate according to claim 1, wherein the plurality of pins further includes a chip power supply pin and a grounding pin;

the plurality of signal lines further include:

a plurality of chip power supply signal lines each extending in the first direction, a chip power supply signal line being coupled to chip power supply pins of the at least one column of driver circuits; and a plurality of grounding signal lines each extending in the first direction, a grounding signal line being coupled to grounding pins of the at least one column of driver circuits.

13. The array substrate according to claim 12, wherein an orthographic projection of the grounding signal line on a plane parallel to a plane where the grounding signal line is located overlaps with an orthographic projection of a driver circuit coupled to the grounding signal line on the plane.

14. A display apparatus, comprising the array substrate according to claim 1.

15. The display apparatus according to claim 14, further comprising:

a driving substrate disposed on a side of the array substrate;

a color filter substrate disposed on a side of the driving substrate away from the array substrate; and a liquid crystal layer disposed between the driving substrate and the color filter substrate.

16. The array substrate according to claim 1, wherein the device power supply signal line is coupled to device groups coupled to at least part of driver circuits in each column of multiple columns of driver circuits.

17. The array substrate according to claim 1, wherein a number of functional elements included in each device group is same.

18. The array substrate according to claim 1, further comprising a controller circuit coupled to the plurality of signal lines, wherein the controller circuit is configured to transmit signals to the plurality of signal lines, respectively.

19. The array substrate according to claim 1, further comprising:

a substrate;

a driving circuit layer disposed on a side of the substrate, wherein the driving circuit layer includes a driving line layer, an insulating layer and a wiring layer that are stacked in sequence, and the plurality of signal lines are located in the driving line layer; and a device layer disposed on the side of the substrate, wherein the plurality of driver circuits and the plurality of device groups are located in the device layer;

wherein the wiring layer includes:

a plurality of chip pads bonded to the plurality of driver circuits;

a plurality of device pads bonded to the plurality of device groups; and a plurality of connection lines, a part of connection lines of the plurality of connection lines being coupled to the plurality of chip pads and the driving line layer, and another part of connection lines of the plurality of connection lines being coupled to the plurality of device pads and the driving line layer.

\* \* \* \* \*